United States Patent [19]
Morinaka et al.

[11] Patent Number: 5,747,847
[45] Date of Patent: May 5, 1998

[54] SEMICONDUCTOR INTEGRATED CIRCUIT DEVICE, METHOD FOR MANUFACTURING THE SAME, AND LOGICAL CIRCUIT

[75] Inventors: Hiroyuki Morinaka; Kimio Ueda; Koichiro Mashiko, all of Tokyo, Japan

[73] Assignee: Mitsubishi Denki Kabushiki Kaisha, Tokyo, Japan

[21] Appl. No.: 708,269

[22] Filed: Sep. 6, 1996

[30] Foreign Application Priority Data

Mar. 18, 1996 [JP] Japan ..................... 8-060795

[51] Int. Cl.$^6$ ............................. H01L 29/788
[52] U.S. Cl. .................. 257/315; 257/318; 257/321
[58] Field of Search ..................... 257/314, 315, 257/318, 321

[56] References Cited

U.S. PATENT DOCUMENTS

| | | | |
|---|---|---|---|
| 4,619,034 | 10/1986 | Janning | 257/318 |
| 5,488,243 | 1/1996 | Tsuruta et al. | 257/314 |
| 5,497,019 | 3/1996 | Mayer et al. | 257/347 |
| 5,604,368 | 2/1997 | Taur et al. | 257/348 |

OTHER PUBLICATIONS

International Electron Device Meeting, pp. 475–478, 1993, T. Iwamatsu, et al., "CAD–Compatible High–Speed CMOS/SIMOX Technology Using Field–Shield Isolation for 1M Gate Array".

*Primary Examiner*—Stephen Meier
*Attorney, Agent, or Firm*—Oblon, Spivak, McClelland, Maier & Neustadt, P.C.

[57] ABSTRACT

A semiconductor integrated circuit device having a SOI structure which can prevent a deterioration in the breakdown voltage of a transistor without damaging integration, and a method for manufacturing the semiconductor integrated circuit device are obtained. An embedded oxide film is not formed over the whole face of a P type silicon layer but has an opening in a region which is placed below a gate electrode. The opening is filled in to form a penetration P layer. Accordingly, a SOI layer is electrically connected to the P type silicon layer through the penetration P layer. The plane position and shape of the gate electrode conform to those of the penetration P layer.

10 Claims, 37 Drawing Sheets

F I G. 5 8
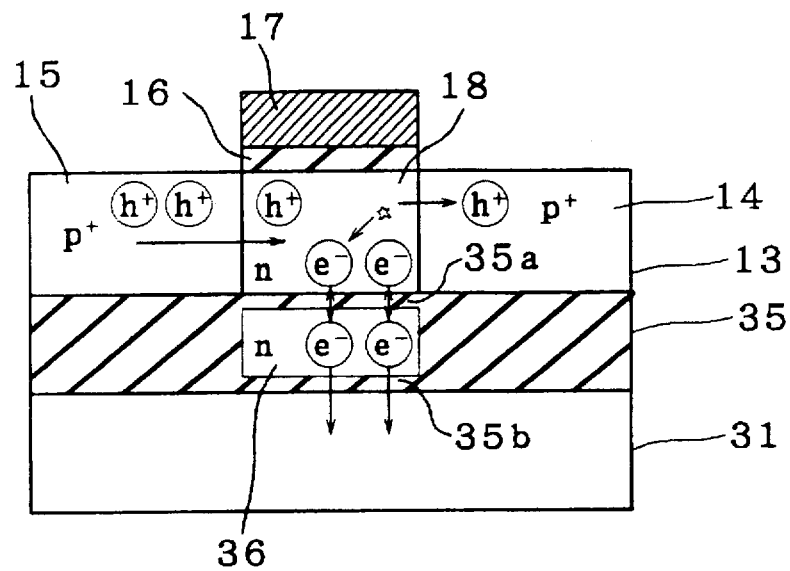
F I G. 5 9
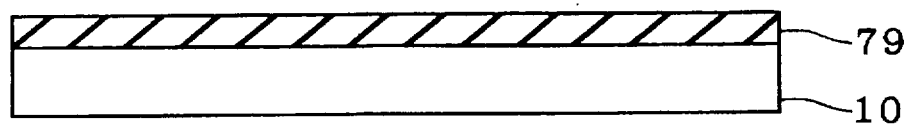
F I G. 6 0
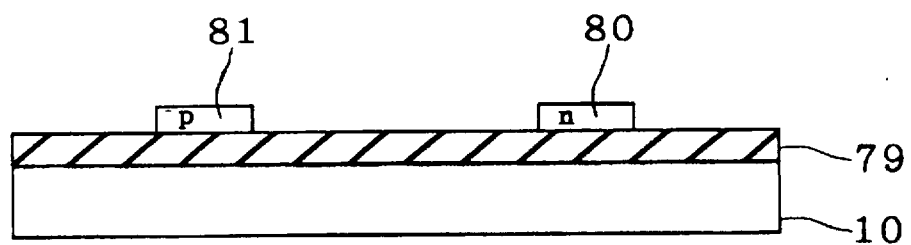

SEMICONDUCTOR INTEGRATED CIRCUIT DEVICE, METHOD FOR MANUFACTURING THE SAME, AND LOGICAL CIRCUIT

BACKGROUND OF THE INVENTION

1. Field of the Invention

The present invention relates to a semiconductor integrated circuit device having a structure in which a semiconductor layer is formed on the surface of an insulating layer.

2. Description of the Background Art

A MOS transistor which is formed on a semiconductor layer (SOI (Silicon On Insulator) substrate) on the surface of an embedded oxide film (insulating layer) has become notable as a device that has smaller parasitic capacity and can implement operation with lower consumed power at a higher speed than a MOS transistor formed on a normal bulk silicon substrate. However, the MOS transistor formed on the SOI substrate has a lower breakdown voltage between source/drain electrodes than that of the MOS transistor formed on the bulk silicon substrate due to the substrate floating effect of a SIO layer which acts as a channel of the transistor.

FIG. 97 shows the mechanism of the substrate floating effect according to an example of an NMOS transistor. As shown in FIG. 97, an embedded oxide film 102 is formed on a P type silicon layer 101, and a SOI layer 103 is formed on the embedded oxide film 102. An N type drain region 104 and an N type source region 105 are selectively formed on the surface of the SOI layer 103. A gate electrode 107 is formed above the SOI layer 103 which is provided between the N type drain region 104 and the N type source region 105. A gate oxide film 106 is disposed between the gate electrode 107 and the SOI layer 103. The surface of the SOI layer 103 provided below the gate electrode 107 is defined as a channel region 108.

According to the transistor formed on the SOI substrate which has the above-mentioned structure (hereinafter referred to as "a SOI transistor" in some cases), holes generated due to ionization by collision which is caused in the vicinity of the drain electrode are charged in the channel region provided below the gate electrode. Consequently, the potential of the channel region rises. A rise in potential induces the injection of electrons from the source electrode. The injected electrons reach the vicinity of the drain electrode to generate new holes due to the ionization by collision.

A feedforward loop caused by electron injection and hole generation lowers a breakdown voltage between the source/drain electrodes. Similarly, the electrons are charged in the channel region to drop the potential of the channel region in the PMOS transistor. As a result, the breakdown voltage of the PMOS transistor is deteriorated. It has been experientially known that the NMOS transistor in which the holes are charged has a greater deterioration in the breakdown voltage. An N channel transistor dominantly influences the deterioration in the breakdown voltage of a semiconductor integrated circuit device having a SOI structure.

FIGS. 98 and 99 show Vds (a voltage between source/drain electrodes)—Ids (a current between source/drain electrodes) characteristics of the MOS transistor formed on the bulk silicon substrate and Vds—Ids characteristics of the MOS transistor formed on the SOI substrate, respectively. In FIG. 98, Vgs (a voltage between source/gate electrodes) is sequentially increased in order of L1, L2, and L3. In FIG. 99, Vgs (a voltage between source/gate electrodes) is sequentially increased in order of L11, L12, and L13.

The MOS transistor formed on the SOI substrate has a low breakdown voltage due to the above-mentioned substrate floating effect. For this reason, when the voltage Vds applied between the source/drain electrodes is increased, the current Ids between the source/drain electrodes is rapidly increased as shown in FIG. 99. Consequently, it is impossible to obtain excellent voltage/current characteristics between the source/drain electrodes as in the MOS transistor formed on the bulk silicon substrate (see FIG. 98).

SUMMARY OF THE INVENTION

A first aspect of the present invention is directed to a semiconductor integrated circuit device, comprising a substrate, an insulating layer formed on the substrate, a semiconductor layer of a first conductivity type formed on the insulating layer, first and second semiconductor regions of a second conductivity type selectively formed on the surface of the semiconductor layer, a gate insulating film formed on the semiconductor layer between the first and second semiconductor regions, and a gate electrode formed on the gate insulating film, wherein the surface of the semiconductor layer provided below the gate electrode is defined as a channel region, and a transistor of the second conductivity type is formed by the gate electrode, the gate insulating film, the first and second semiconductor regions and the channel region, and wherein the insulating layer has, in a region placed below the gate electrode, a carrier drainable region which can drain carriers charged in the channel region into other portions than the channel region.

A second aspect of the present invention is directed to the semiconductor integrated circuit device wherein the carrier drainable region may include a thin film insulating region having such a thickness that carriers can move between the semiconductor layer and the substrate by a tunnel phenomenon.

A third aspect of the present invention is directed to the semiconductor integrated circuit device wherein the thin film insulating region may be formed on the semiconductor layer side.

A fourth aspect of the present invention is directed to the semiconductor integrated circuit device wherein the thin film insulating region may be formed on the substrate side.

A fifth aspect of the present invention is directed to the semiconductor integrated circuit device wherein the carrier drainable region may include a carrier charge layer, a first thin film insulating region provided between the carrier charge layer and the channel region, having such a thickness that carriers can move between the carrier charge layer and the channel region by a tunnel phenomenon, and a second thin film insulating region provided between the carrier charge layer and the substrate, having such a thickness that carriers can move between the carrier charge layer and the substrate by the tunnel phenomenon.

A sixth aspect of the present invention is directed to the semiconductor integrated circuit device wherein the carrier drainable region may include a second gate electrode, and a thin film insulating region provided between the carrier charge layer and the second gate electrode, having such a thickness that carriers can move between the channel region and the second gate electrode by a tunnel phenomenon.

A seventh aspect of the present invention is directed to a semiconductor integrated circuit device, comprising a substrate, an insulating layer formed on the substrate having an opening, a penetration semiconductor layer formed with the opening filled in, a semiconductor layer of a first conductivity type formed on the insulating layer including the penetration semiconductor layer, first and second semiconductor regions of a second conductivity type selectively formed on the surface of the semiconductor layer, a gate insulating film formed on the semiconductor layer between the first and second semiconductor regions, and a gate electrode formed on the gate insulating film, wherein the surface of the semiconductor layer provided below the gate electrode is defined as a channel region, and a transistor of the second conductivity type is formed by the gate electrode, the gate insulating film, the first and second semiconductor regions and the channel region, and wherein the plane position and shape of the gate electrode conform to those of the penetration semiconductor layer.

An eighth aspect of the present invention is directed to a method for manufacturing a semiconductor integrated circuit device, comprising the steps of (a) preparing a substrate, (b) forming an insulating layer on the substrate, the insulating layer being provided with a thin film insulating region having such a thickness that a tunnel phenomenon occurs, (c) forming a semiconductor layer of a first conductivity type on the insulating layer, (d) forming a gate electrode above the semiconductor layer with a gate insulating film disposed therebetween, the surface of the semiconductor layer provided below the gate electrode being defined as a channel region, the thin film insulating region being placed below the gate electrode, and (e) introducing impurities of a second conductivity type into the semiconductor layer by using the gate electrode as a mask so as to form first and second semiconductor regions of the second conductivity type in the surface of the semiconductor layer, a transistor of the second conductivity type being formed by the gate electrode, the gate insulating film, the first and second semiconductor regions and the channel region.

A ninth aspect of the present invention is directed to a method for manufacturing a semiconductor integrated circuit device, comprising the steps of (a) preparing a substrate, (b) forming a first partial insulating layer on the substrate, the first partial insulating layer having such a thickness that a tunnel phenomenon occurs, (c) forming a carrier charge layer of a first conductivity type on the first partial insulating layer, (d) forming a second partial insulating layer on the first partial insulating layer with the carrier charge layer covered, the first and second partial insulating layers being unified to form an insulating layer, the insulating layer provided on the carrier charge layer having such a thickness that the tunnel phenomenon occurs, (e) forming a semiconductor layer of the first conductivity type on the insulating layer, (f) forming a gate electrode above the semiconductor layer with a gate insulating film disposed therebetween, the surface of the semiconductor layer provided below the gate electrode being defined as a channel region, the carrier charge layer being placed below the gate electrode, and (g) introducing impurities of a second conductivity type into the semiconductor layer by using the gate electrode as a mask so as to form first and second semiconductor regions of the second conductivity type in the surface of the semiconductor layer, a transistor of the second conductivity type being formed by the gate electrode, the gate insulating film, the first and second semiconductor regions and the channel region.

A tenth aspect of the present invention is directed to a method for manufacturing a semiconductor integrated circuit device, comprising the steps of (a) preparing a substrate, (b) forming a first partial insulating layer on the substrate, (c) forming an auxiliary gate electrode on the first partial insulating layer, (d) forming a second partial insulating layer on the first partial insulating layer with the auxiliary gate electrode covered, the first and second partial insulating layers being unified to form an insulating layer, the insulating layer provided on the auxiliary gate electrode having such a thickness that a tunnel phenomenon occurs, (e) forming a semiconductor layer of a first conductivity type on the insulating layer, (f) forming a gate electrode above the semiconductor layer with a gate insulating film disposed therebetween, the surface of the semiconductor layer provided below the gate electrode being defined as a channel region, the auxiliary gate electrode being placed below the gate electrode, and (g) introducing impurities of a second conductivity type into the semiconductor layer by using the gate electrode as a mask so as to form first and second semiconductor regions of the second conductivity type in the surface of the semiconductor layer, a transistor of the second conductivity type being formed by the gate electrode, the gate insulating film, the first and second semiconductor regions and the channel region.

An eleventh aspect of the present invention is directed to a method for manufacturing a semiconductor integrated circuit device, comprising the steps of (a) preparing a substrate, (b) forming an insulating layer on the substrate, the insulating film having an opening on a part thereof, (c) filling in the opening to form a semiconductor layer of a first conductivity type on the insulating layer, the semiconductor layer which fills in the opening being defined as a penetration semiconductor layer, (d) forming a gate electrode above the semiconductor layer with a gate insulating film disposed therebetween, the surface of the semiconductor layer provided below the gate electrode being defined as a channel region, the plane position and shape of the gate electrode conforming to those of the opening, and (e) introducing impurities of a second conductivity type into the semiconductor layer by using the gate electrode as a mask so as to form first and second semiconductor regions of the second conductivity type on the surface of the semiconductor layer, a transistor of the second conductivity type being formed by the gate electrode, the gate insulating film, the first and second semiconductor regions and the channel region.

According to the first aspect of the present invention, the insulating layer of the semiconductor integrated circuit device has, in the region placed below the gate electrode, the carrier drainable region which can drain the carriers charged in the channel region into the other portions than the channel region. Consequently, predetermined conditions are set to cause the carrier drainable region to function so that the carriers charged in the channel region can be drained into the other portions than the channel region.

As a result, it is possible to prevent a deterioration in the breakdown voltage of the transistor from occurring due to the charge of the carriers in the channel region. Furthermore, the carrier drainable region which is placed below the semiconductor layer drains the carriers. Consequently, integration is not damaged.

In addition, the channel region is completely brought into the floating state by the insulating layer. Consequently, substrate bias effect has no bad influence.

According to the second aspect of the present invention, the carrier drainable region of the semiconductor integrated circuit device includes the thin film insulating region having such a thickness that the carriers can move between the semiconductor layer and the substrate by the tunnel phenomenon. Consequently, the carriers charged in the channel region can be drained into the substrate by setting a difference in potential between the substrate and the gate electrode such that the tunnel phenomenon occurs in the thin film insulating region in the direction in which the carriers move from the channel region to the substrate.

The gate capacity of the transistor can be reduced by the presence of the thin film insulating region. Consequently, the transistor operation can keep high-speed properties.

According to the third aspect of the present invention, the thin film insulating region is formed on the semiconductor layer side. Consequently, it is possible to use the semiconductor layer having the same structure as in the prior art.

According to the fourth aspect of the present invention, the thin film insulating region is formed on the substrate side. Consequently, it is possible to use the substrate having the same structure as in the prior art.

According to the fifth aspect of the present invention, the carrier drainable region of the semiconductor integrated circuit device includes the carrier charge layer and the first and second thin film insulating regions. Consequently, the carriers charged in the channel region can be drained into the carrier charge layer by setting a difference in potential between the substrate and the gate electrode to a first condition on which the tunnel phenomenon occurs in the first thin film insulating region in the direction in which the carriers move from the channel region to the carrier charge layer. Furthermore, the carriers charged in the carrier charge layer can be drained into the substrate by setting the difference in potential between the substrate and the gate electrode to a second condition on which the tunnel phenomenon occurs in the second thin film insulating region in the direction in which the carriers move from the carrier charge layer to the substrate.

By setting the difference in potential between the substrate and the gate electrode on a condition reverse to the first condition, the carriers charged in the carrier charge layer can be returned to the channel region for reuse.

Furthermore, the gate capacity of the transistor can be reduced by the presence of the first and second thin film insulating regions. Consequently, the transistor operation can keep high-speed properties.

According to the sixth aspect of the present invention, the carrier drainable region of the semiconductor integrated circuit device includes the second gate electrode and the thin film insulating region. Consequently, the carriers charged in the channel region can be drained into the second gate electrode by setting the difference in potential between the substrate and the gate electrode such that the tunnel phenomenon occurs in the thin film insulating region from the channel region to the second gate electrode.

The gate capacity of the transistor can be reduced by the presence of the thin film insulating region. Consequently, the transistor operation can keep high-speed properties.

According to the seventh aspect of the present invention, the carriers charged in the channel region can be drained into the substrate through the penetration semiconductor layer.

As a result, it is possible to prevent a deterioration in the breakdown voltage of the transistor from occurring due to the charge of the carriers in the channel region. Furthermore, the carriers are drained through the penetration semiconductor layer which is placed below the semiconductor layer. Consequently, integration is not damaged.

In addition, the plane position and shape of the gate electrode conform to those of the penetration semiconductor layer. Consequently, it is possible to manufacture the gate electrode and the penetration semiconductor layer by the photolithographic technique using the same mask.

According to the eighth aspect of the present invention, the carriers charged in the channel region can be drained into the substrate by setting the difference in potential between the substrate and the gate electrode such that the tunnel phenomenon occurs in the thin film insulating region in the direction in which the carriers move from the channel region to the substrate.

According to the ninth aspect of the present invention, the carriers charged in the channel region can be drained into the carrier charge layer by setting the difference in potential between the substrate and the gate electrode to a first condition on which the tunnel phenomenon occurs in the first thin film insulating region in the direction in which the carriers move from the channel region to the carrier charge layer. Furthermore, the carriers charged in the carrier charge layer can be drained into the substrate by setting the difference in potential between the substrate and the gate electrode to a second condition on which the tunnel phenomenon occurs in the second thin film insulating region in the direction in which the carriers move from the carrier charge layer to the substrate.

By setting the difference in potential between the substrate and the gate electrode on a condition reverse to the first condition, the carriers charged in the carrier charge layer can be returned to the channel region for reuse.

According to the tenth aspect of the present invention, the carriers charged in the channel region can be drained into the second gate electrode by setting the difference in potential between the substrate and the gate electrode such that the tunnel phenomenon occurs in the thin film insulating region from the channel region to the second gate electrode.

According to the eleventh aspect of the present invention, the carriers charged in the channel region can be drained into the substrate through the penetration semiconductor layer.

As a result, it is possible to prevent a deterioration in the breakdown voltage of the transistor from occurring due to the charge of the carriers in the channel region. Furthermore, the carriers are drained through the penetration semiconductor layer which is placed below the semiconductor layer. Consequently, integration is not damaged.

In addition, the plane position and shape of the gate electrode conform to those of the opening. Consequently, it is possible to execute the steps (b) and (d) by the photolithography using the same mask.

In order to solve the above-mentioned problems, it is an object of the present invention to provide a semiconductor integrated circuit device having a SOI structure which can prevent a deterioration in the breakdown voltage of a transistor without damaging integration, and a method for manufacturing the semiconductor integrated circuit device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 58 is a sectional view showing the structure of a P type SOI transistor according to the fourth embodiment of the present invention;

FIG. 59 is a sectional view showing a method for manufacturing the SOI transistor according to the fourth embodiment of the present invention;

FIG. 60 is a sectional view showing the method for manufacturing the SOI transistor according to the fourth embodiment of the present invention;

DESCRIPTION OF THE PREFERRED EMBODIMENTS

<<First Embodiment>>
<NMOS Structure>

Figure 1:
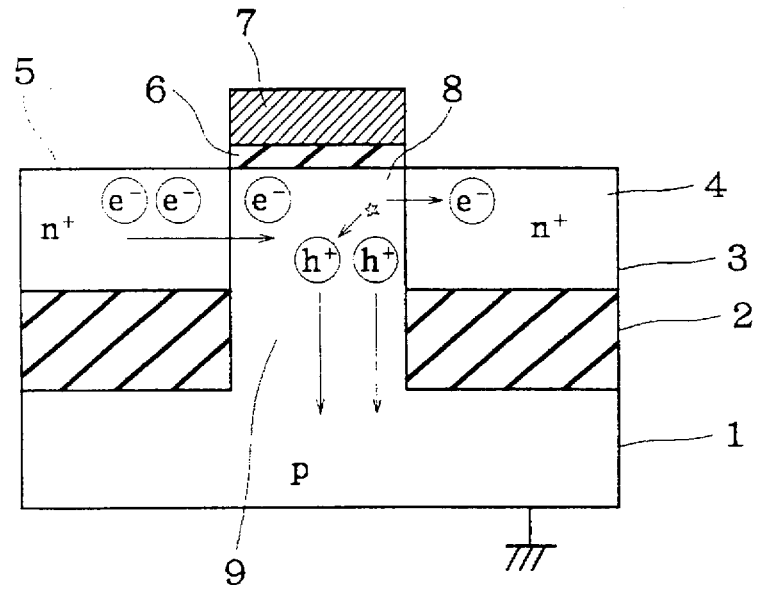
FIG. 1 is a sectional view showing the structure of an N type SOI transistor according to a first embodiment of the present invention.

FIG. 1 is a sectional view showing a SOI transistor having an NMOS structure according to a first embodiment of the present invention. As shown in FIG. 1, an embedded oxide film 2 is formed on a P type silicon layer 1 grounded to a GND level, and a SOI layer 3 is formed on the embedded oxide film 2. An N type drain region 4 and an N type source region are selectively formed on the surface of the SOI layer 3. A gate electrode 7 is formed above the SOI layer 3 which is provided between the N type drain region 4 and the N type source region 5. A gate oxide film 6 is disposed between the gate electrode 7 and the SOI layer 3. The surface of the SOI layer 3 provided below the gate electrode 7 is defined as a channel region 8.

Unlike the structure according to the prior art, the embedded oxide film 2 of an N type SOI transistor according to the first embodiment is not formed over the whole face of the P type silicon layer 1 but has an opening in a region which is placed below the gate electrode 7. A penetration P layer 9 is formed with the opening filled in. Accordingly, the SOI layer 3 is electrically connected to the P type silicon layer 1 through the penetration P layer 9. The plane position and shape of the gate electrode 7 conform to those of the penetration P layer 9. In the N type SOI transistor having the above-mentioned structure according to the first embodiment, holes generated in the vicinity of the N type drain region 4 due to ionization by collision are not charged in the channel region 8 but can be drained into the P type silicon layer 1 grounded to the GND level through the penetration P layer 9. As a result, a feedforward loop can be surely prevented from occurring due to the ionization by collision. Consequently, there is no phenomenon in which a current Ids which flows between source/drain electrodes is rapidly increased when a voltage Vds applied between the source/drain electrodes is increased. Thus, excellent voltage/current characteristics can be obtained between the source/drain electrodes so that a deterioration in the breakdown voltage of the transistor can be prevented. In addition, a structure in which the holes are drained downward does not damage integration.

<PMOS Structure>

Figure 2:
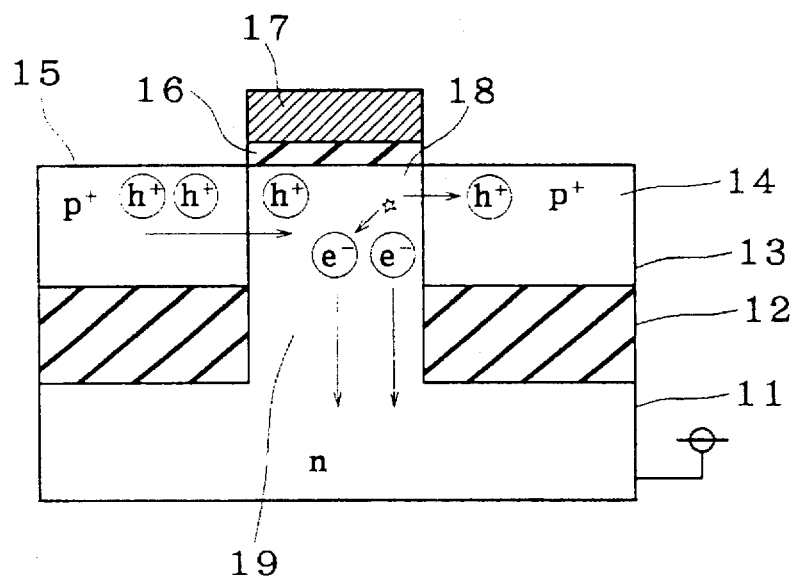
FIG. 2 is a sectional view showing the structure of a P type SOI transistor according to the first embodiment of the present invention.
Figure 3:
FIG. 3 is a sectional view showing a method for manufacturing the SOI transistor according to the first embodiment of the present invention.

FIG. 2 is a sectional view showing a SOI transistor having a PMOS structure according to the first embodiment of the present invention. As shown in FIG. 2, an embedded oxide film 12 is formed on an N type silicon layer 11 connected to a power source VDD, and a SOI layer 13 is formed on the embedded oxide film 12. A P type drain region 14 and a P type source region 15 are selectively formed on the surface of the SOI layer 13. A gate electrode 17 is formed above the SOI layer 13 which is provided between the P type drain region 14 and the P type source region 15. A gate oxide film 16 is disposed between the gate electrode 17 and the SOI layer 13. The surface of the SOI layer 13 provided below the gate electrode 17 is defined as a channel region 18.

Unlike the structure according to the prior art, the embedded oxide film 12 of a P type SOI transistor according to the first embodiment is not formed over the whole face of the N type silicon layer 11 but has an opening in a region which is placed below the gate electrode 17. A penetration N layer 19 is formed with the opening filled in. Accordingly, the SOI layer 13 is electrically connected to the N type silicon layer 11 through the penetration N layer 19. The plane position and shape of the gate electrode 17 conform to those of the penetration N layer 19.

In the P type SOI transistor having the above-mentioned structure according to the first embodiment, electrons generated in the vicinity of the P type drain region 14 due to ionization by collision are not charged in the channel region 18 but can be drained, through the penetration N layer 19, into the N type silicon layer 11 connected to the power source VDD. As a result, a feedforward loop can be surely prevented from occurring due to the ionization by collision. Consequently, there is no phenomenon in which a current Ids which flows between the source/drain electrodes is rapidly increased when a voltage Vds applied between the source/drain electrodes is increased. Thus, excellent voltage/current characteristics can be obtained between the source/drain electrodes so that a deterioration in the breakdown voltage of the transistor can be prevented. In addition, a structure in which the electrons are drained downward does not damage integration.

<Manufacturing Method>

FIGS. 3 to 17 are sectional views showing a method for manufacturing SOI transistors (PMOS and NMOS transistors) according to the first embodiment.

Figure 4:
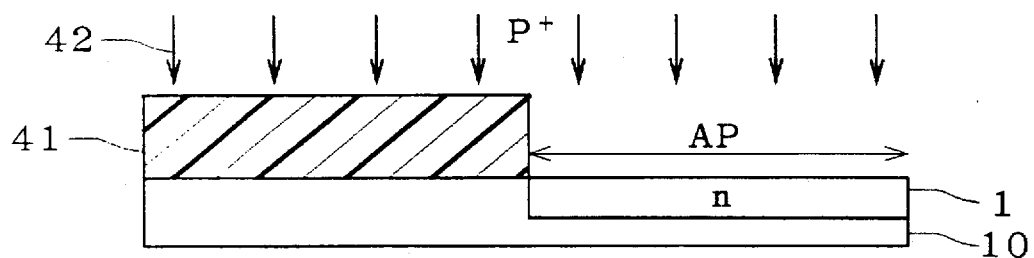
FIG. 4 is a sectional view showing the method for manufacturing the SOI transistor according to the first embodiment of the present invention.
Figure 5:
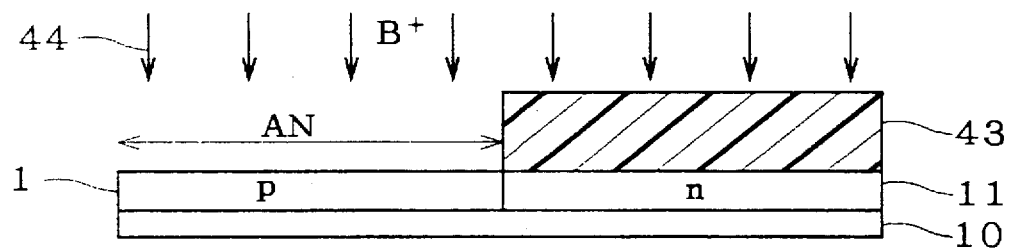
FIG. 5 is a sectional view showing the method for manufacturing the SOI transistor according to the first embodiment of the present invention.

First of all, a silicon substrate 10 (FIG. 3) is prepared. A resist 41 is applied so as to open a PMOS transistor formation region AP by using the photolithographic technique. Then, phosphorus 42 is implanted to form a P type silicon layer 1 of the PMOS transistor (FIG. 4). Similarly, a resist 43 is applied so as to open an NMOS transistor formation region AN by using the photolithographic technique. Then, boron 44 is implanted to form a well region of the NMOS transistor (FIG. 5).

Figure 6:
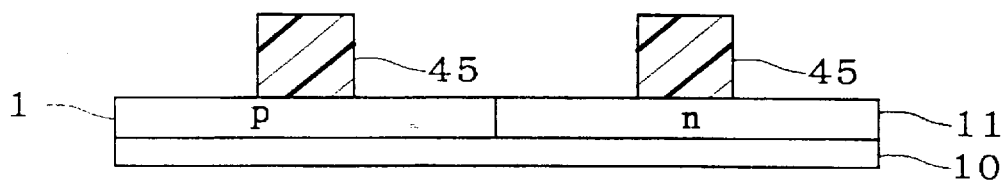
FIG. 6 is a sectional view showing the method for manufacturing the SOI transistor according to the first embodiment of the present invention.

Next, only regions in which the gate electrodes of the PMOS/NMOS transistors should be formed are coated with a resist 45 by using the photolithographic technique. A mask which is used for the photolithography to form the resist 45 is utilized also at the step of forming a gate electrode as an after-step (FIG. 6). A mask for gate electrode formation which is necessary for the steps of manufacturing a SOI transistor according to the prior art can be utilized for the formation of the resist 45.

Figure 7:
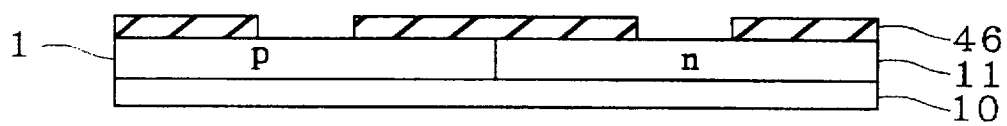
FIG. 7 is a sectional view showing the method for manufacturing the SOI transistor according to the first embodiment of the present invention.

Then, the resist 45 is used as a mask to form a silicon oxide film 46 in other portions than the regions in which the gate electrodes of the PMOS/NMOS transistors should be formed (FIG. 7).

Figure 8:
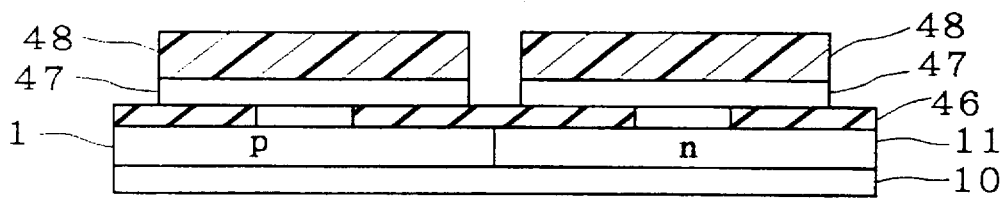
FIG. 8 is a sectional view showing the method for manufacturing the SOI transistor according to the first embodiment of the present invention.
Figure 9:
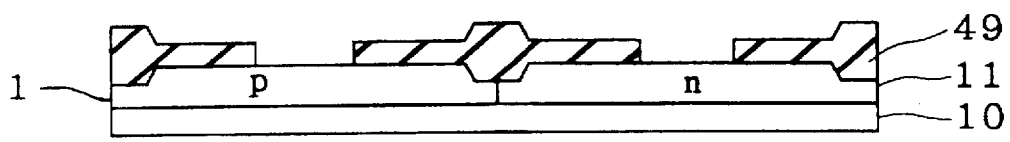
FIG. 9 is a sectional view showing the method for manufacturing the SOI transistor according to the first embodiment of the present invention.

Thereafter, a silicon nitride film 47 having an opening only in a portion which should be field-isolated is formed on the silicon oxide film 46 by using the photolithographic technique. The silicon nitride film 47 is coated with a resist 48 (FIG. 8). Subsequently, a field oxide film 49 is formed by using the selective oxidation method in which the silicon nitride film 47 and the resist 48 act as a mask (FIG. 9).

Figure 10:
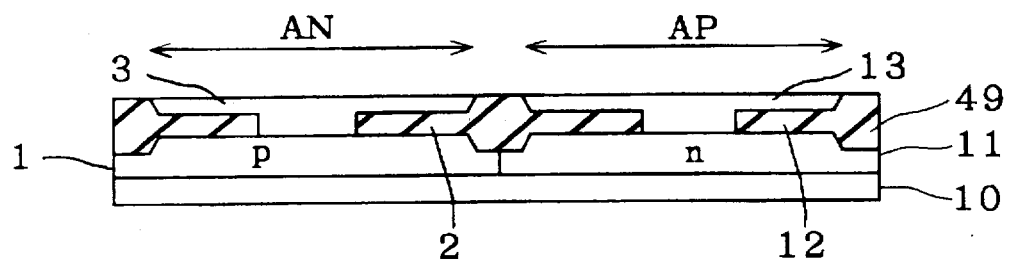
FIG. 10 is a sectional view showing the method for manufacturing the SOI transistor according to the first embodiment of the present invention.

Next, a SOI layer 13 is formed in the PMOS transistor formation region AP, and a SOI layer 3 is formed in the NMOS transistor formation region AN. In this case, the SOI layers 3 and 13 are formed to have a smaller thickness than that of the field oxide film 49 which is formed in FIG. 9 in order to isolate the PMOS transistor from the NMOS transistor (FIG. 10). The region of the field oxide film 49 in which the gate electrode should be formed is penetrated. For this reason, the SOI layer 13 is formed also in a penetration portion.

Figure 11:
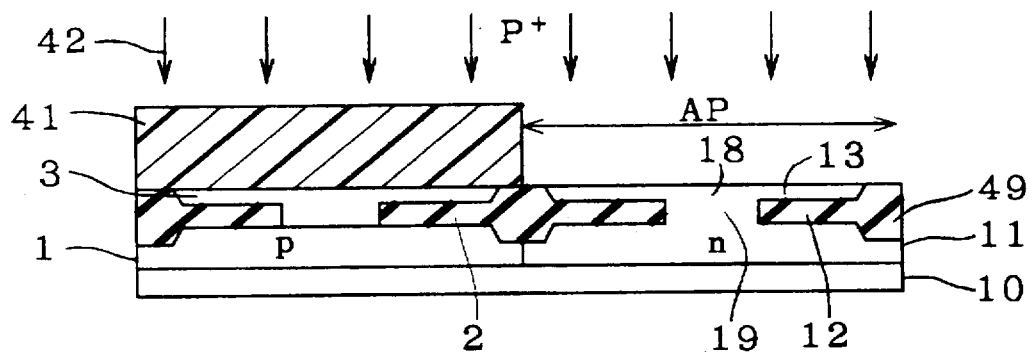
FIG. 11 is a sectional view showing the method for manufacturing the SOI transistor according to the first embodiment of the present invention.

In the same manner as the step shown in FIG. 4, a resist 41 is applied so as to form the PMOS transistor formation region AP by using the photolithographic technique. Then, the phosphorus 42 is implanted to form a channel region 18 of the PMOS transistor (FIG. 11). In this case, a penetration N layer 19 is simultaneously formed in the penetration portion of the field oxide film 49 of the PMOS transistor formation region AP.

Figure 12:
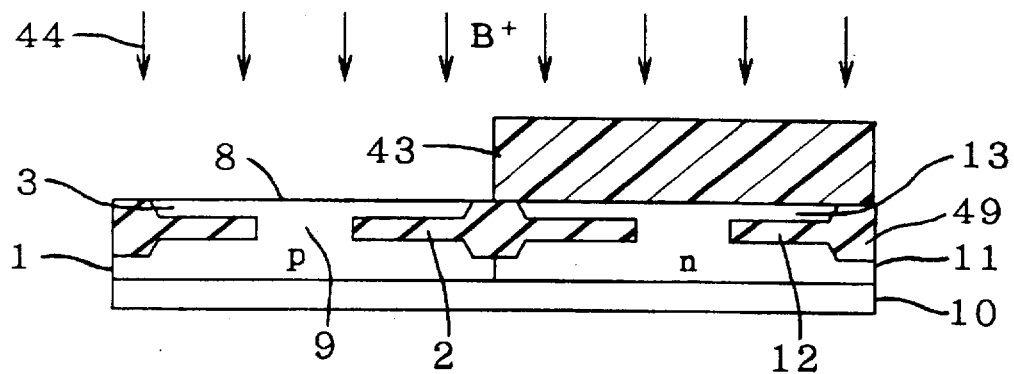
FIG. 12 is a sectional view showing the method for manufacturing the SOI transistor according to the first embodiment of the present invention.

In the same manner as the step shown in FIG. 5, a resist 43 is applied so as to open the NMOS transistor formation region AN by using the photolithographic technique. Then, the boron 44 is implanted to form a channel region 8 of the NMOS transistor (FIG. 12). In this case, a penetration N layer 9 is simultaneously formed in the penetration portion of the field oxide film 49 of the NMOS transistor formation region AN.

Figure 13:
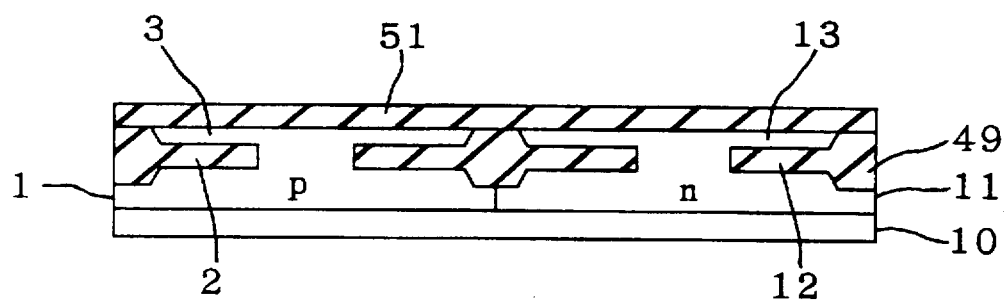
FIG. 13 is a sectional view showing the method for manufacturing the SOI transistor according to the first embodiment of the present invention.
Figure 14:
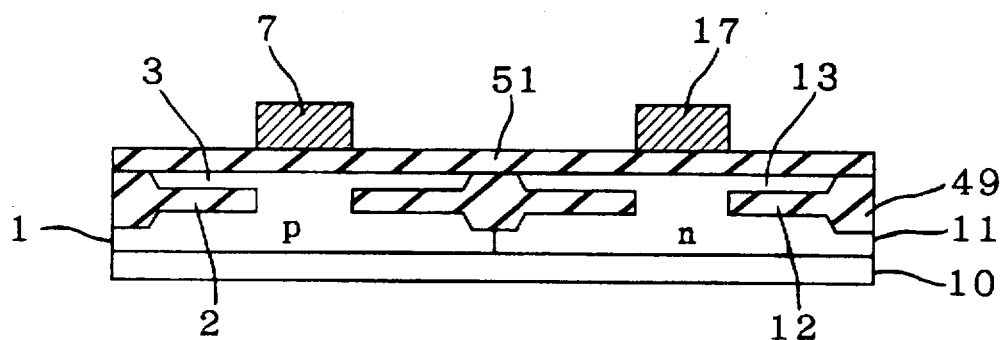
FIG. 14 is a sectional view showing the method for manufacturing the SOI transistor according to the first embodiment of the present invention.

Then, a silicon oxide film 51 is formed over the whole face (FIG. 13). By using the photolithographic technique, gate electrodes 17 and 7 are formed of polysilicon, for example. Oxide films formed under the gate electrodes 17 and 7 are defined as gate oxide films 16 and 6. A mask for the formation of the resist 45 which is used at the step shown in FIG. 6 described above is utilized for the photolithography (FIG. 14).

Figure 15:
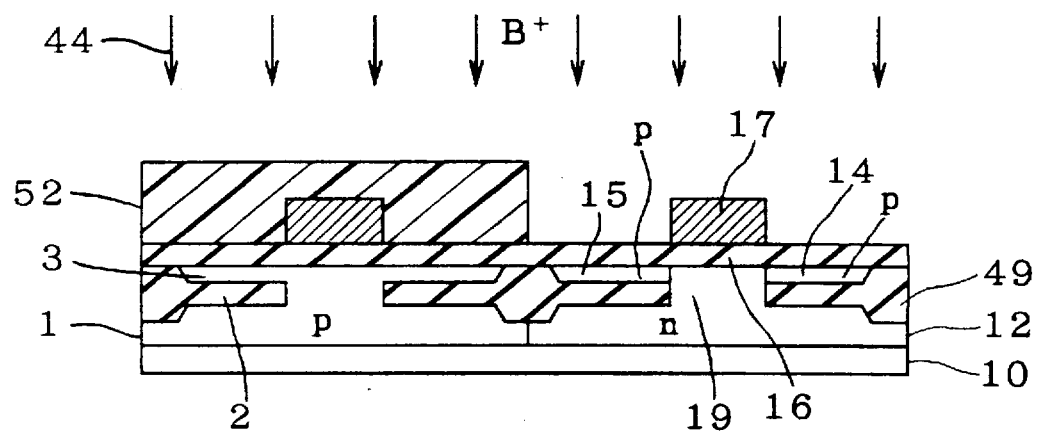
FIG. 15 is a sectional view showing the method for manufacturing the SOI transistor according to the first embodiment of the present invention.

Thereafter, a resist 52 is applied so as to open the source/drain formation regions of the PMOS transistor by using the photolithographic technique. Then, the boron 44 is implanted to form a P type drain region 14 and a P type source region 15 of the PMOS transistor (FIG. 15). The gate electrode 17 acts as a mask so that the implantation of the boron 44 into the channel region 18 is blocked.

Figure 16:
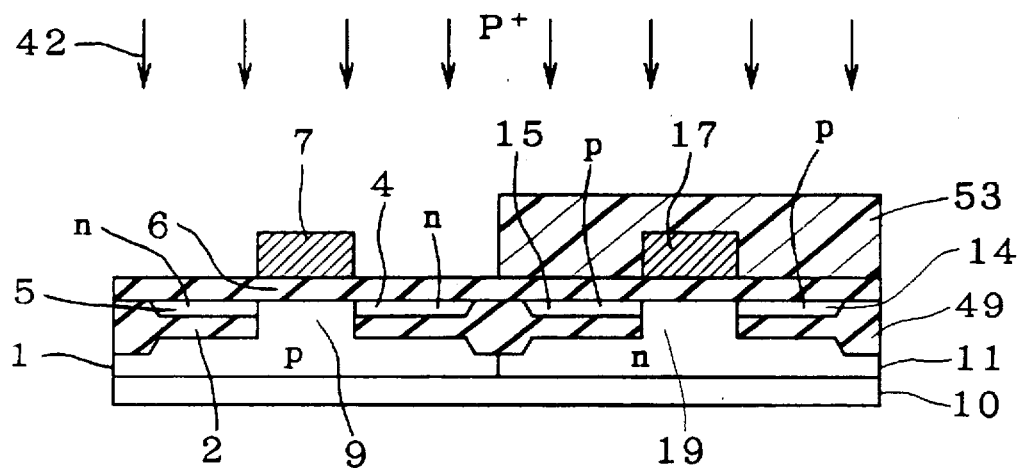
FIG. 16 is a sectional view showing the method for manufacturing the SOI transistor according to the first embodiment of the present invention.

Similarly, a resist 53 is applied so as to open the source/drain formation regions of the NMOS transistor by using the photolithographic technique. Then, the phosphorus 42 is implanted to form an N type drain region 4 and an N type source region 5 of the NMOS transistor (FIG. 16). In this case, the gate electrode 7 acts as a mask so that the implantation of the phosphorus 42 into the channel region 8 is blocked.

Figure 17:
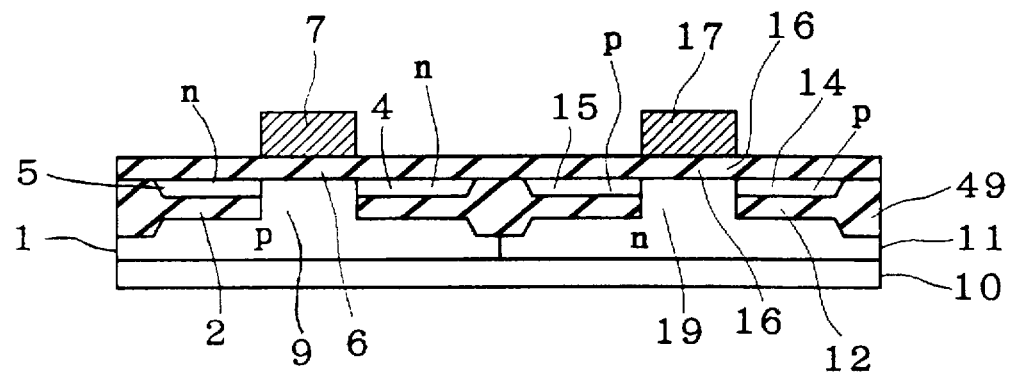
FIG. 17 is a sectional view showing the method for manufacturing the SOI transistor according to the first embodiment of the present invention.

As a result of the above-mentioned steps, the SOI transistors having NMOS and PMOS structures shown in FIGS. 1 and 2 can be manufactured as shown in FIG. 17.

<Logical Circuit>

Figure 85A:
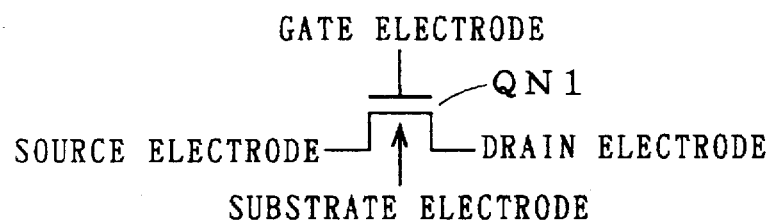
FIGS. 85(a) and 85(b) are circuit diagrams of the SOI transistor according to the first embodiment of the present invention.
Figure 85B:
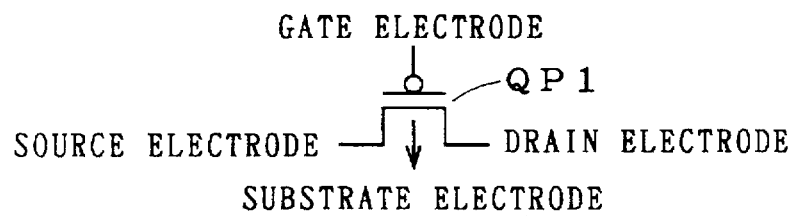

The NMOS transistor (having the structure of FIG. 1) according to the first embodiment is shown by a circuit diagram of FIG. 85(a), and the PMOS transistor (having the structure of FIG. 2) according to the first embodiment is shown by a circuit diagram of FIG. 85(b).

Figure 86:
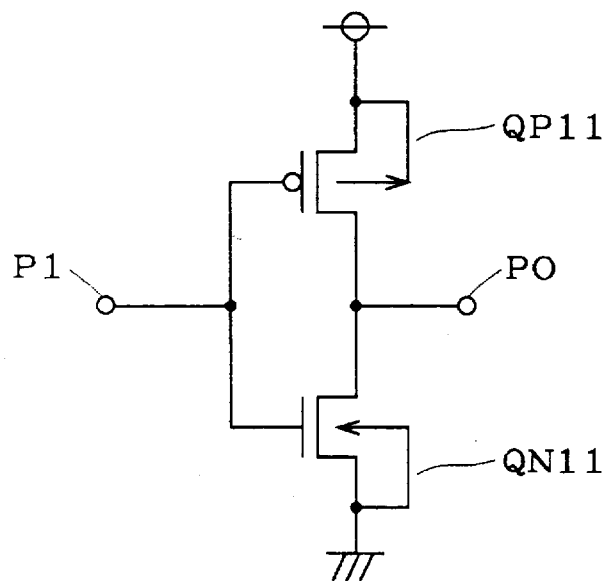
FIG. 86 is a diagram showing an inverter circuit formed by the SOI transistor according to the first embodiment of the present invention.

FIG. 86 is a diagram showing an inverter circuit formed by the SOI transistor according to the first embodiment. As shown in FIG. 86, the source of a PMOS transistor QP11 is connected to a power source VDD, the drain of an NMOS transistor QN11 is connected to the drain of the PMOS transistor QP11, and the source of the NMOS transistor QN11 is grounded to a GND level. The substrate potential of the PMOS transistor QP11 (the potential of the N type silicon layer 11) is set to a supply potential VDD. The substrate potential of the NMOS transistor QN11 (the potential of the P type silicon layer 1) is grounded to the GND level. The gates of the PMOS transistor QP11 and NMOS transistor QN11 are connected to an input terminal P1. The drains of the PMOS transistor QP11 and NMOS transistor QN11 are connected to an output terminal PO in common.

According to such a structure, an inverter circuit in which a signal sent from the input terminal P1 is logically inverted and output to the output terminal PO can have excellent breakdown voltage properties.

Figure 87:
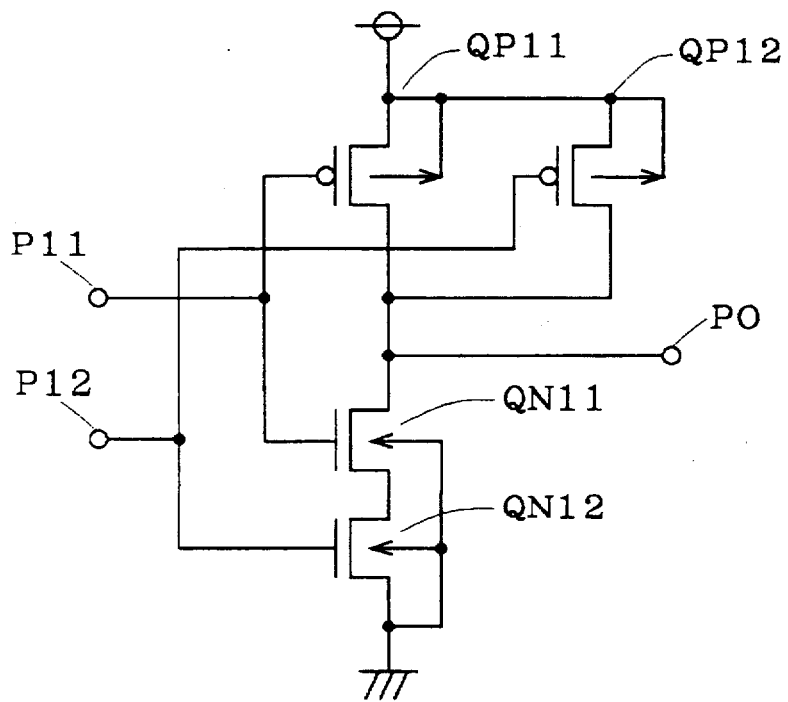
FIG. 87 is a diagram showing a NAND circuit formed by the SOI transistor according the first embodiment of the present invention.

FIG. 87 is a diagram showing an NAND gate circuit formed by the SOI transistor according to the first embodiment. As shown in FIG. 87, the sources of PMOS transistors QP11 and QP12 are connected to a power source VDD in common, the drain of an NMOS transistor QN11 is connected to the drains of the PMOS transistors QP11 and QP12, the drain of an NMOS transistor QN12 is connected to the source of the NMOS transistor QN11, and the source of the PMOS transistor QP12 is grounded to a GND level.

The substrate potentials of the PMOS transistors QP11 and QP12 are set to the supply potential VDD. The substrate potentials of the NMOS transistors QN11 and QN12 are grounded to the GND level. The gates of the PMOS transistor QP11 and NMOS transistor QN11 are connected to an input terminal P11. The gates of the PMOS transistor QP12 and NMOS transistor QN12 are connected to an input terminal P12. The drains of the PMOS transistors QP12 and QP12 and the drain of the NMOS transistor QN11 are connected to an output terminal PO in common.

According to such a structure, a NAND circuit in which the result of NAND operation of first and second signals sent from the input terminals P11 and P12 is output to the output terminal PO can have excellent breakdown voltage properties.

<<Second Embodiment>><NMOS Structure>

Figure 18:
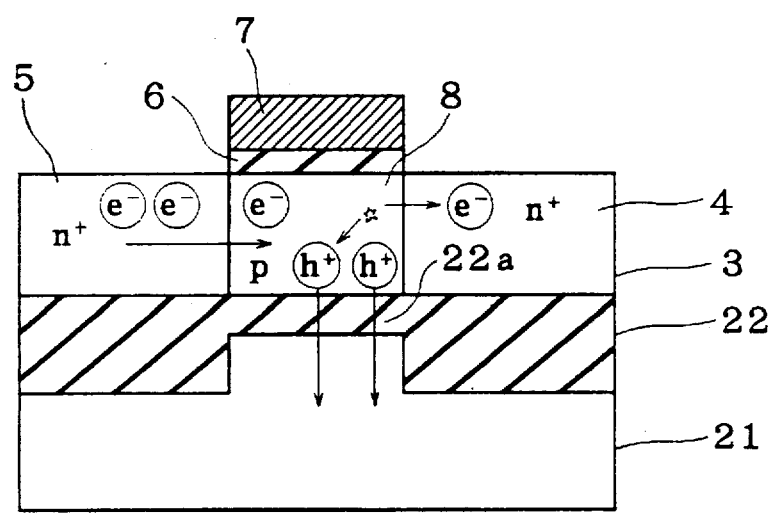
FIG. 18 is a sectional view showing the structure of an N type SOI transistor according to a second embodiment of the present invention.

FIG. 18 is a sectional view showing a SOI transistor having all NMOS structure according to a second embodiment of the present invention. As shown in FIG. 18, an embedded oxide film 22 is formed on a silicon layer 21, and a SOI layer 3 is formed on the embedded oxide film 22. An N type drain region 4 and an N type source region 5 are selectively formed on the surface of the SOI layer 3. A gate electrode 7 is formed above the SOI layer 3 which is provided between the N type drain region 4 and the N type source region 5. A gate oxide film 6 is disposed between the gate electrode 7 and the SOI layer 3. The surface of the SOI layer 3 provided below the gate electrode 7 is defined as a channel region 8.

Unlike the structure according to the prior art, the thickness of a thin film oxide region 22a, which is placed below the gate electrode 7, of the embedded oxide film 22 of an N type SOI transistor according to the second embodiment is reduced in the lower portion thereof such that tunnel effect fully occurs. Consequently, the thickness of the silicon layer 21 in the region which is placed below the gate electrode 7 is increased in the direction of the embedded oxide film 22a. The plane shape and position of the gate electrode 7 conform to those of the thin film oxide region 22a.

According to such a structure, the potential of the silicon layer 21 (a negative potential against the potential of the gate electrode 7) is set such that the tunnel effect fully occurs in the embedded oxide film 22. Consequently, holes generated in the vicinity of the N type drain region 4 due to ionization by collision are not charged in the channel region 8 but can be drained into the silicon layer 21 through the embedded oxide film 22 by the tunnel effect. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. A structure in which the holes are drained downward does not damage integration.

In addition, the channel region 8 is completely brought into the floating state by the embedded oxide film 22. Consequently, a bad influence is not caused by back gate effect (substrate bias effect). Furthermore, the gate capacity of the transistor (a value obtained by connecting, in series, the capacities of the gate oxide film 6, a depletion layer provided below the gate electrode 7, and the embedded oxide film 22) is decreased. Consequently, high-speed properties can be kept as transistor characteristics. The thin film oxide region 22a is formed on the SOI layer 3 side. For this reason, it is sufficient that the SOI layer 3 has the same structure as that of the SOI layer according to the prior art.

<PMOS Structure>

Figure 19:
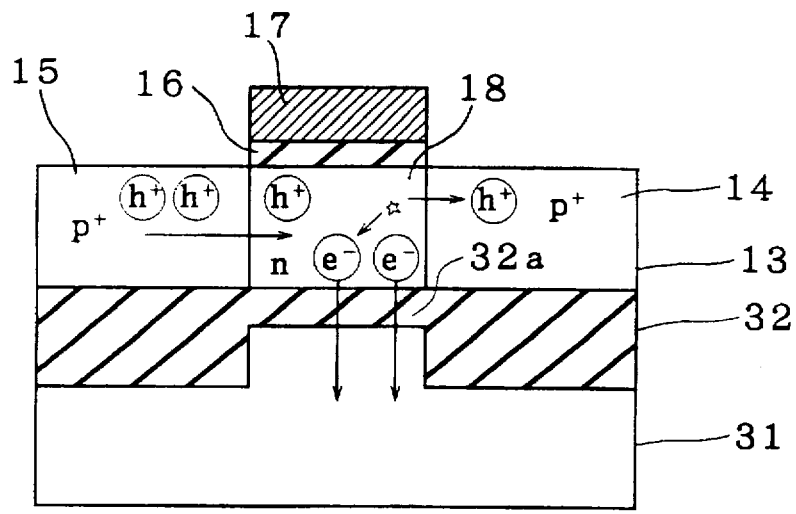
FIG. 19 is a sectional view showing the structure of a P type SOI transistor according to the second embodiment of the present invention.

FIG. 19 is a sectional view showing a SOI transistor having a PMOS structure according to the second embodiment of the present invention. As shown in FIG. 19, an embedded oxide film 32 is formed on a silicon layer 31, and a SOI layer 13 is formed on the embedded oxide film 32. A P type drain region 14 and a P type source region 15 are selectively formed on the surface of the SOI layer 13. A gate electrode 17 is formed above the SOI layer 13 which is provided between the P type drain region 14 and the P type source region 15. A gate oxide film 16 is disposed between the gate electrode 17 and the SOI layer 13. The surface of the SOI layer 13 provided below the gate electrode 17 is defined as a channel region 18.

Unlike the structure according to the prior art, the thickness of a thin film oxide region 32a, which is placed below the gate electrode 17, of the embedded oxide film 32 of a P type SOI transistor according to the second embodiment is reduced in the lower portion thereof such that the tunnel effect fully occurs. Consequently, the thickness of the silicon layer 31 in the region which is placed below the gate electrode 17 is increased in the direction of the thin film oxide region 32a. The plane position and shape of the gate electrode 17 conform to those of the thin film oxide region 32a.

According to such a structure, the potential of the silicon layer 31 (a high potential against the potential of the gate electrode 17) is set such that the tunnel effect fully occurs in the embedded oxide film 32. Consequently, electrons generated in the vicinity of the P type drain region 14 due to ionization by collision are not charged in the channel region 18 but can be drained into the silicon layer 31 through the embedded oxide film 32 by the tunnel effect. As a result, a feedforward loop can be surely prevented from occurring due to the ionization by collision. Thus, excellent voltage/ current characteristics can be obtained between the source/drain electrodes so that a deterioration in the breakdown voltage of the transistor can be prevented. A structure in which the electrons are drained downward does not damage integration.

In addition, the channel region 18 is completely brought into the floating state by the embedded oxide film 32. Consequently, a bad influence is not caused by back gate effect (substrate bias effect). Furthermore, the gate capacity of the transistor (a value obtained by connecting, in series, the capacities of the gate oxide film 16, a depletion layer provided below the gate electrode 17, and the embedded oxide film 32) is decreased. Consequently, the high-speed properties can be kept as the transistor characteristics. The thin film oxide region 32a is formed on the SOI layer 13 side. For this reason, it is sufficient that the SOI layer 13 has the same structure as that of the SOI layer according to the prior art.

<Manufacturing Method>

FIGS. 20 to 30 are sectional views showing a method for manufacturing SOI transistors (PMOS and NMOS transistors) according to the second embodiment.

Figure 20:
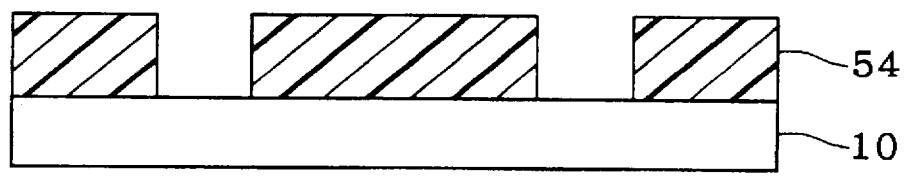
FIG. 20 is a sectional view showing a method for manufacturing the SOI transistor according to the second embodiment of the present invention.

First of all, a silicon substrate 10 is coated with a resist 54 so as to open portions in which gate electrodes should be formed in PMOS/NMOS transistor formation regions by using the photolithographic technique as shown in FIG. 20. A mask which is used for the photolithography to form the resist 54 is utilized also at the step of forming a gate electrode as an after-step. Consequently, it is possible to use a mask for the photolithography to form a gate electrode which is necessary for the steps of manufacturing a SOI transistor according to the prior art.

Figure 21:
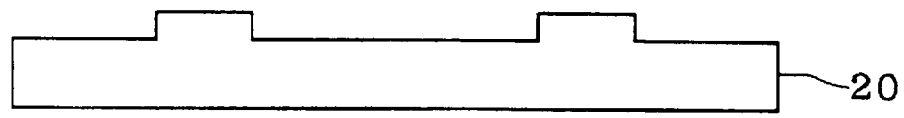
FIG. 21 is a sectional view showing the method for manufacturing the SOI transistor according to the second embodiment of the present invention.
Figure 22:
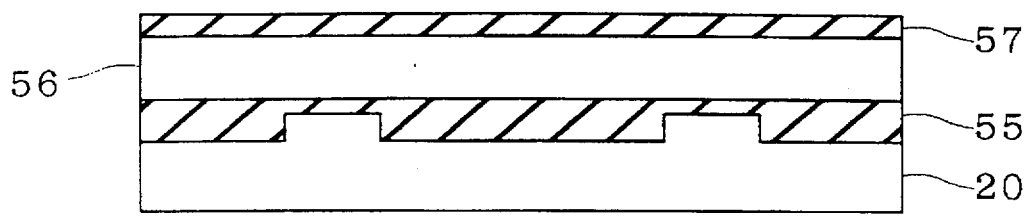
FIG. 22 is a sectional view showing the method for manufacturing the SOI transistor according to the second embodiment of the present invention.
Figure 23:
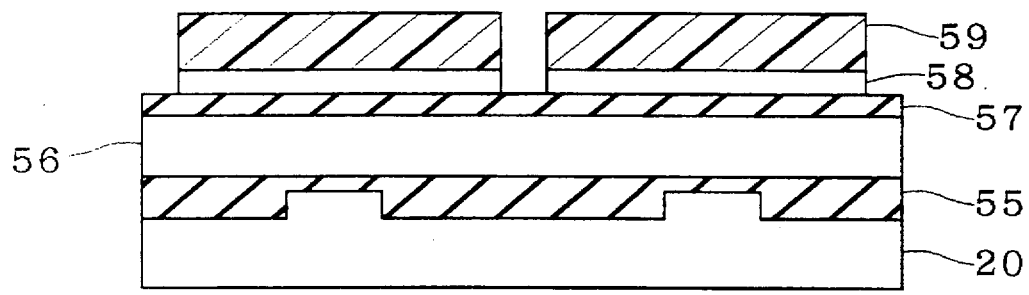
FIG. 23 is a sectional view showing the method for manufacturing the SOI transistor according to the second embodiment of the present invention.

Next, the resist 54 is used as a mask to form a silicon layer on the silicon substrate 10 in the regions in which the gate electrodes of the PMOS/NMOS transistors should be formed. Thus, a silicon substrate 20 having protruded regions in which the gate electrodes should be formed is obtained (FIG. 21). Then, a SOI layer 56 is formed over the whole face. A silicon oxide film 57 is formed on the SOI layer 56 (FIG. 22). Thereafter, a silicon nitride film 58 having an opening only in a portion which should be field-isolated is formed on the silicon oxide film 57 by using the photolithographic technique. The silicon nitride film 58 is coated with a resist 59 (FIG. 23).

Figure 24:
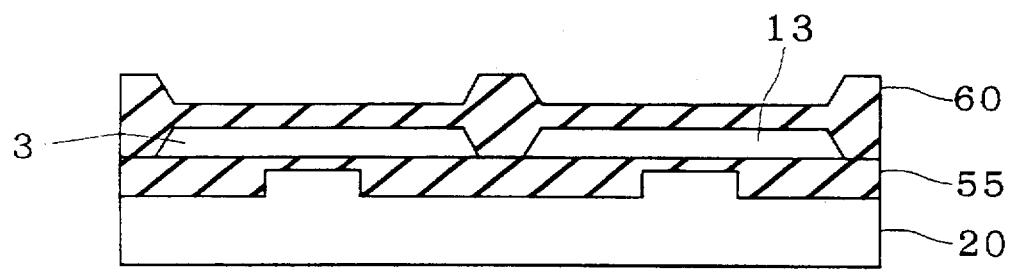
FIG. 24 is a sectional view showing the method for manufacturing the SOI transistor according to the second embodiment of the present invention.

Thereafter, a field oxide film 60 is formed by using the selective oxidation method in which the silicon nitride film 58 and the resist 58 act as a mask (FIG. 24). In this case, the SOI layer 56 is divided into SOI layers 13 and 3.

Figure 25:
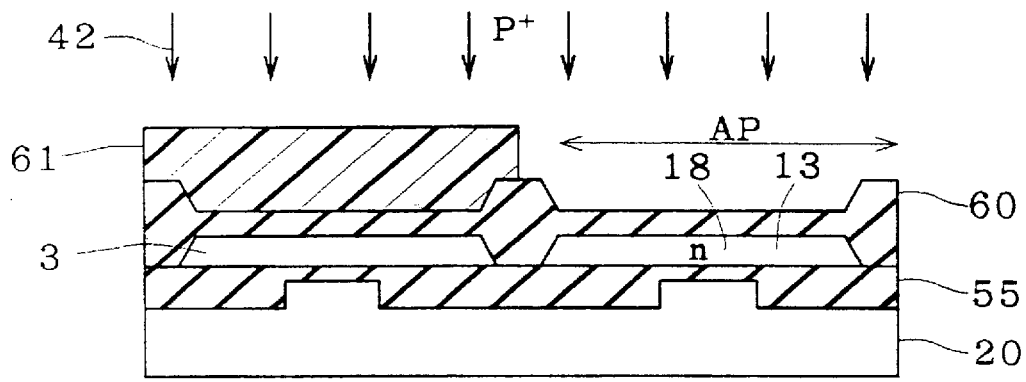
FIG. 25 is a sectional view showing the method for manufacturing the SOI transistor according to the second embodiment of the present invention.
Figure 26:
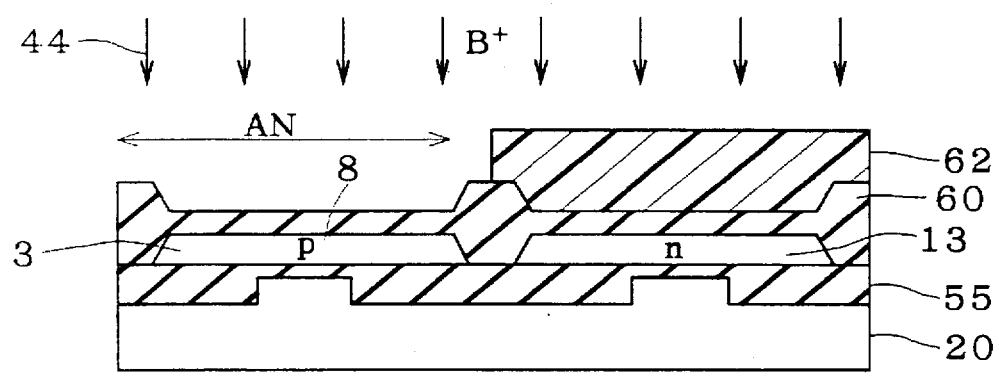
FIG. 26 is a sectional view showing the method for manufacturing the SOI transistor according to the second embodiment of the present invention.

Subsequently, a resist 61 is applied so as to open a PMOS transistor formation region AP by using the photolithographic technique. Then, phosphorus 42 is implanted to form a channel region 18 of the PMOS transistor (FIG. 25). Similarly, a resist is applied so as to open an NMOS transistor formation region AN by using the photolithographic technique. Then, boron 44 is implanted to form a channel region 8 of the NMOS transistor (FIG. 26).

Figure 27:
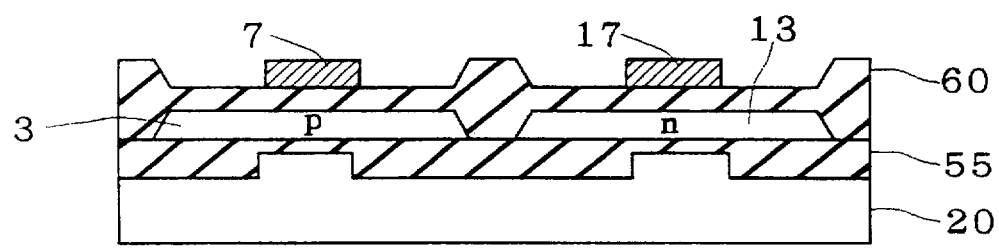
FIG. 27 is a sectional view showing the method for manufacturing the SOI transistor according to the second embodiment of the present invention.
Figure 28:
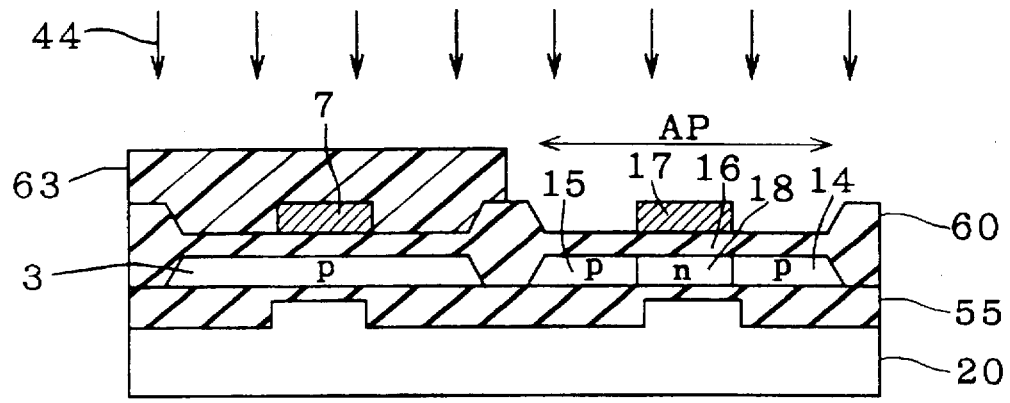
FIG. 28 is a sectional view showing the method for manufacturing the SOI transistor according to the second embodiment of the present invention.

By using the photolithographic technique, gate electrodes 17 and 7 are then formed of polysilicon, for example. Oxide films formed under the gate electrodes 17 and 7 are defined as gate oxide films 16 and 6. A mask which is used for the photolithography to form the resist 54 at the step shown in FIG. 20 described above is utilized for the photolithography to form the gate electrodes 17 and 7 (FIG. 27). Thereafter, a resist 63 is applied so as to open the PMOS transistor formation region AP by using the photolithographic technique. Then, the boron 44 is implanted to form a P type drain region 14 and a P type source region 15 of the PMOS transistor (FIG. 28). In this case, the gate electrode 17 acts as a mask so that the implantation of the boron 44 into the channel region 18 is blocked.

Figure 29:
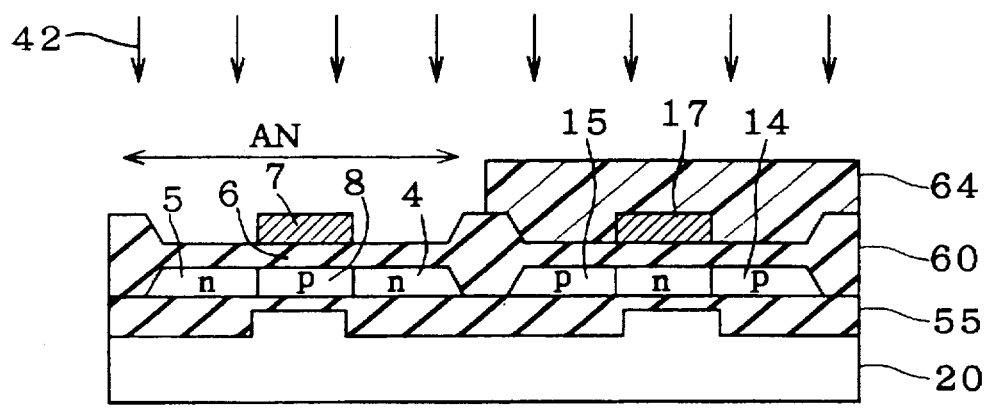
FIG. 29 is a sectional view showing the method for manufacturing the SOI transistor according to the second embodiment of the present invention.

Similarly, a resist 64 is applied so as to open the NMOS transistor formation region AN by using the photolithographic technique. Then, the phosphorus 42 is implanted to form an N type drain region 4 and an N type source region 5 of the NMOS transistor. In this case, the gate electrode 7 acts as a mask so that the implantation of the phosphorus 42 into the channel region 8 is blocked (FIG. 29).

Figure 30:
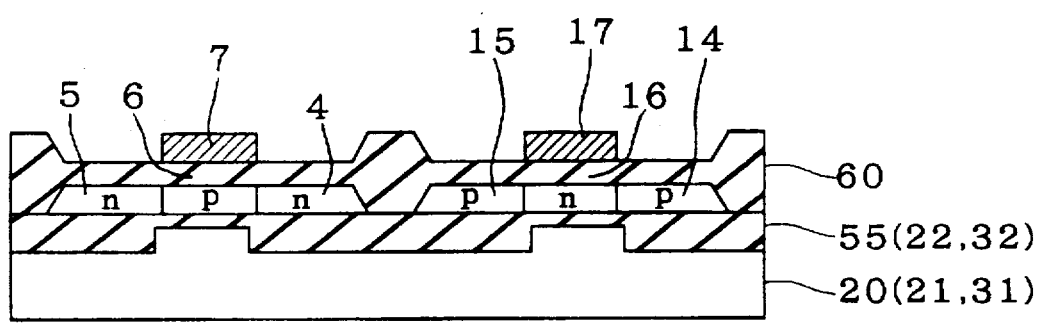
FIG. 30 is a sectional view showing the method for manufacturing the SOI transistor according to the second embodiment of the present invention.

As a result of the above-mentioned steps, the SOI transistors having NMOS and PMOS structures shown in FIGS. 18 and 19 can be manufactured as shown in FIG. 30.

<Logical Circuit>

Figure 88A:
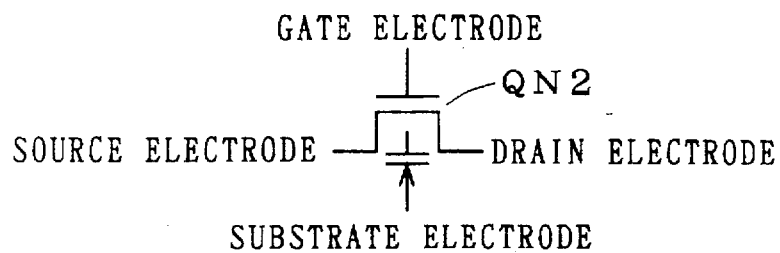
FIGS. 88(a) and 88(b) are circuit diagrams of the SOI transistor according to the second embodiment of the present invention.
Figure 88B:
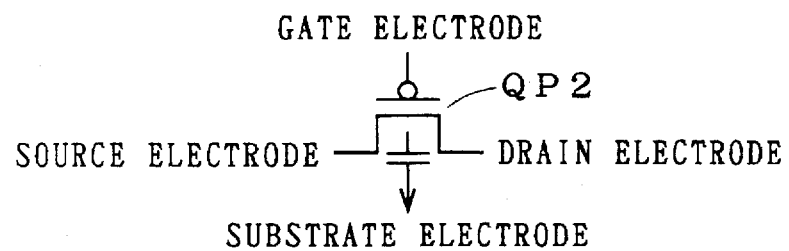

The NMOS transistor (having the structure of FIG. 18) according to the second embodiment is shown by a circuit diagram of FIG. 88(a), and the PMOS transistor (having the structure of FIG. 19) according to the second embodiment is shown by a circuit diagram of FIG. 88(b).

Figure 89:
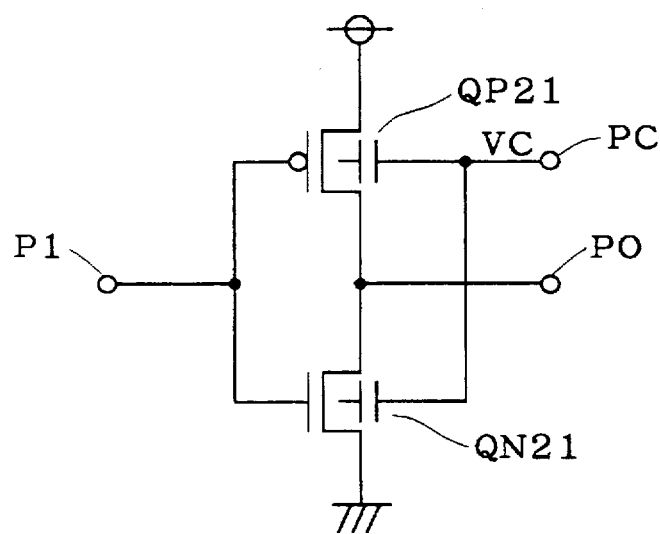
FIG. 89 is a diagram showing an inverter circuit formed by the SOI transistor according to the second embodiment of the present invention.

FIG. 89 is a diagram showing an inverter circuit formed by the SOI transistor according to the second embodiment. As shown in FIG. 89, the source of a PMOS transistor QP21 is connected to a power source VDD, the drain of an NMOS transistor QN21 is connected to the drain of the PMOS transistor QP21, and the source of the NMOS transistor QN21 is grounded to a GND level. The substrate potential of the PMOS transistor QP21 (the potential of the silicon layer 31) and the substrate potential of the NMOS transistor QN21 (the potential of the silicon layer 21) are set to a control voltage VC obtained from a control terminal PC. The gates of the PMOS transistor QP21 and NMOS transistor QN21 are connected to an input terminal P1. The drains of the PMOS transistor QP21 and NMOS transistor QN21 are connected to an output terminal PO in common.

According to such a structure, an inverter circuit in which a signal sent from the input terminal P1 is logically inverted and output to the output terminal PO can be formed.

In this case, the control voltage VC is set to such a negative voltage that the tunnel effect fully occurs in the embedded oxide film 22 provided between the SOI layer 3 and the silicon layer 21 of the NMOS transistor QN21. Consequently, holes charged in the channel region 8 of the NMOS transistor QN21 can be drained into the silicon layer 21. For example, the control voltage VC is normally set to the GND level and is periodically set to a negative potential such that the holes can be drained into the silicon layer 21.

Similarly, the control voltage VC is set to such a high voltage that the tunnel effect fully occurs in the embedded oxide film 32 provided between the SOI layer 13 and the silicon layer 31 of the PMOS transistor QP21. Consequently, electrons charged in the channel region 18 of the PMOS transistor QP21 can be drained into the silicon layer 31. For example, the control voltage VC is normally set to a power supply VDD level and is periodically set to a high potential such that the electrons can be drained.

An inverter circuit having excellent breakdown voltage properties can be obtained by the control voltage VC.

Figure 90:
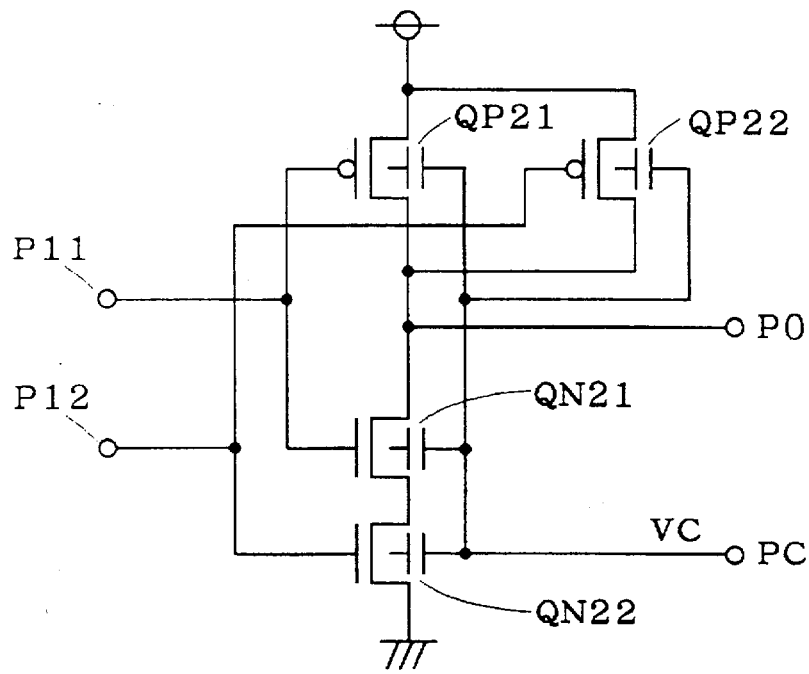
FIG. 90 is a diagram showing a NAND circuit formed by the SOI transistor according the second embodiment of the present invention.

FIG. 90 is a diagram showing an NAND gate circuit formed by the SOI transistor according to the second embodiment. As shown in FIG. 90, the sources of PMOS transistors QP21 and QP22 are connected to a power source VDD in common, the drain of an NMOS transistor QN21 is connected to the drains of the PMOS transistors QP21 and QP22, the drain of an NMOS transistor QN22 is connected to the source of the NMOS transistor QN21, and the source of a PMOS transistor QP22 is grounded to the GND level.

The substrate potentials of the PMOS transistors QP21 and QP22 and those of the NMOS transistors QN21 and QN22 are set to a control voltage VC obtained from a control terminal PC. The gates of the PMOS transistor QP21 and NMOS transistor QN21 are connected to an input terminal P11. The gates of the PMOS transistor QP22 and NMOS transistor QN22 are connected to an input terminal P12. The drains of the PMOS transistors QP21 and QP22 and the drain of the NMOS transistor QN21 are connected to an output terminal PO in common.

According to such a structure, a NAND circuit in which the result of NAND operation of first and second signals sent from the input terminals P11 and P12 is output to the output terminal PO can be formed.

As described above, the holes charged in the channel regions 8 of the NMOS transistors QN21 and QN22 are drained into the silicon layers 21 or the electrons charged in the channel regions 18 of the PMOS transistors QP21 and QP22 are drained into the silicon layers 31 by the control voltage VC. Thus, a NAND circuit having excellent breakdown voltage properties can be obtained.

<<Third Embodiment>>

<NMOS Structure>

Figure 31:
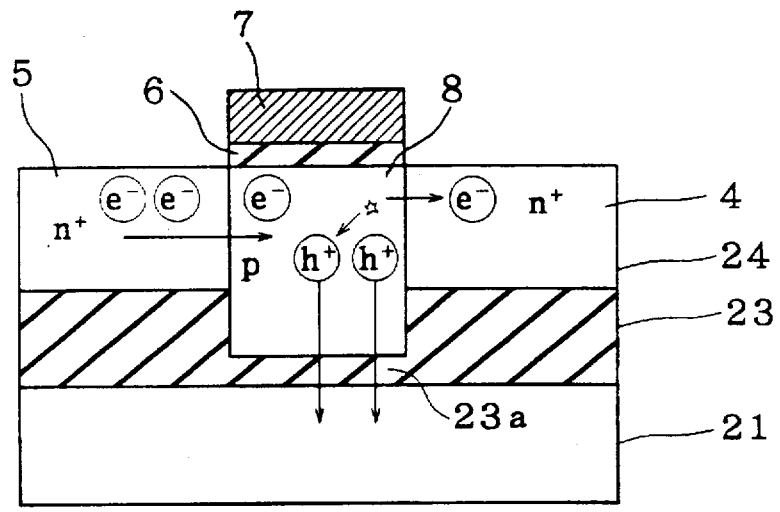
FIG. 31 is a sectional view showing the structure of an N type SOI transistor according to a third embodiment of the present invention.

FIG. 31 is a sectional view showing a SOI transistor having an NMOS structure according to a third embodiment of the present invention. As shown in FIG. 31, an embedded oxide film 23 is formed on a silicon layer 21, and a SOI layer 24 is formed on the embedded oxide film 23. An N type drain region 4 and an N type source region 5 are selectively formed on the surface of the SOI layer 24. A gate electrode 7 is formed above the SOI layer 24 which is provided between the N type drain region 4 and the N type source region 5. A gate oxide film 6 is disposed between the gate electrode 7 and the SOI layer 24. The surface of the SOI layer 24 provided below the gate electrode 7 is defined as a channel region 8.

Unlike the structure according to the prior art, the thickness of a thin film oxide region 23a, which is placed below the gate electrode 7, of the embedded oxide film 23 of an N type SOI transistor according to the third embodiment is reduced in the upper portion thereof such that tunnel effect fully occurs. Consequently, the thickness of the SOI layer 24 in the region which is placed below the gate electrode 7 is increased in the direction of the thin film oxide region 23a. The plane shape and position of the gate electrode 7 conform to those of the thin film oxide region 23a.

According to such a structure, the potential of the silicon layer 21 (a negative potential against the potential of the gate electrode 7) is set such that the tunnel effect fully occurs in the embedded oxide film 23. Consequently, holes generated in the vicinity of the N type drain region 4 due to ionization by collision are not charged in the channel region 8 but can be drained into the silicon layer 21 through the embedded oxide film 23 by the tunnel effect. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. A structure in which the holes are drained downward does not damage integration. Furthermore, the thin film oxide region 23a is formed on the silicon layer 21 side. For this reason, it is sufficient that the silicon layer 21 has the same shape as in the prior art.

In addition, the channel region 8 is completely brought into the floating state by the embedded oxide film 23. Consequently, a bad influence is not caused by back gate effect (substrate bias effect). Furthermore, the gate capacity of the transistor (a value obtained by connecting, in series, the capacities of the gate oxide film 6, a depletion layer provided below the gate electrode 7, and the embedded oxide film 23) is decreased. Consequently, high-speed properties can be kept as transistor characteristics.

<PMOS Structure>

Figure 32:
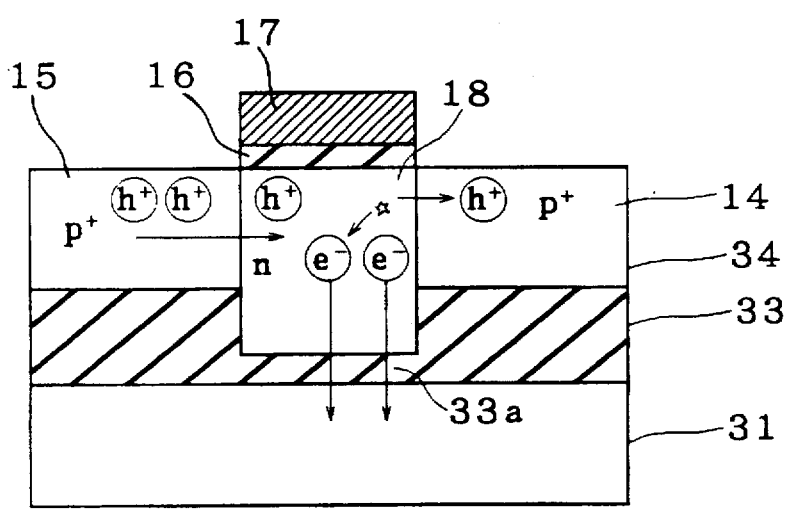
FIG. 32 is a sectional view showing the structure of a P type SOI transistor according to the third embodiment of the present invention.

FIG. 32 is a sectional view showing a SOI transistor having a PMOS structure according to the third embodiment of the present invention. As shown in FIG. 32, an embedded oxide film 33 is formed on a silicon layer 31, and a SOI layer 34 is formed on the embedded oxide film 33. A P type drain region 14 and a P type source region 15 are selectively formed on the surface of the SOI layer 34. A gate electrode 17 is formed above the SOI layer 34 which is provided between the P type drain region 14 and the P type source region 15. A gate oxide film 16 is disposed between the gate electrode 17 and the SOI layer 34. The surface of the SOI layer 34 provided below the gate electrode 17 is defined as a channel region 18.

Unlike the structure according to the prior art, the thickness of a thin film oxide region 33a, which is placed below the gate electrode 17, of the embedded oxide film 33 of a P type SOI transistor according to the third embodiment is reduced in the upper portion thereof such that tunnel effect fully occurs. Consequently, the thickness of the SOI layer 34 in the region which is placed below the gate electrode 17 is increased in the direction of the thin film oxide region 33a. The plane position and shape of the gate electrode 17 conform to those of the thin film oxide region 33a.

According to such a structure, the potential of the silicon layer 31 (a high potential against the potential of the gate electrode 17) is set such that the tunnel effect fully occurs in the embedded oxide film 33. Consequently, electrons generated in the vicinity of the P type drain region 14 due to ionization by collision are not charged in the channel region 18 but can be drained into the silicon layer 31 through the embedded oxide film 33 by the tunnel effect. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. In addition, a structure in which the electrons are drained downward does not damage integration. Furthermore, the thin film oxide region 33a is formed on the silicon layer 31 side. For this reason, it is sufficient that the silicon layer 31 has the same shape as in the prior art.

In addition, the channel region 18 is completely brought into the floating state by the embedded oxide film 33. Consequently, a bad influence is not caused by back gate effect (substrate bias effect). Furthermore, the gate capacity of the transistor (a value obtained by connecting, in series, the capacities of the gate oxide film 16, a depletion layer provided below the gate electrode 17, and the embedded oxide film 33) is decreased. Consequently, the high-speed properties can be kept as the transistor characteristics.

<First Manufacturing Method>

FIGS. 33 to 44 are sectional views showing a first method for manufacturing SOI transistors (PMOS and NMOS transistors) according to the third embodiment.

Figure 33:
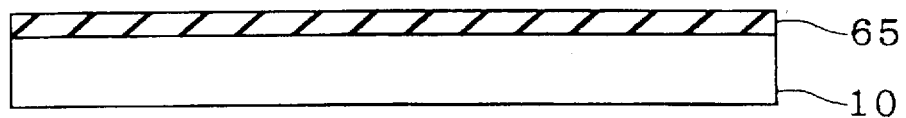
FIG. 33 is a sectional view showing a first method for manufacturing the SOI transistor according to the third embodiment of the present invention.

First of all, a silicon oxide film 65 having such a small thickness that the tunnel effect fully occurs is formed on a silicon substrate 10 by the thermal oxidation method or the like (FIG. 33). Then, a silicon nitride film 66 is formed, by using the photolithographic technique, only in a region on the silicon oxide film 65 where a gate electrode should be formed. The silicon nitride film 66 is coated with a resist 67.

Figure 34:
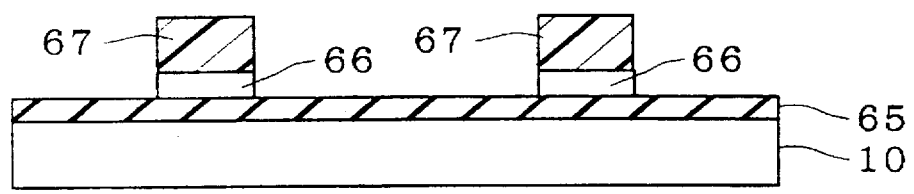
FIG. 34 is a sectional view showing the first method for manufacturing the SOI transistor according to the third embodiment of the present invention.

A mask which is used for the photolithography to form the resist 67 (the silicon nitride film 66) is utilized at the step of forming a gate electrode as an after-step (FIG. 34). Consequently, it is possible to use a mask for the photolithography to form a gate electrode necessary for the steps of manufacturing a SOI transistor according to the prior art.

Figure 35:
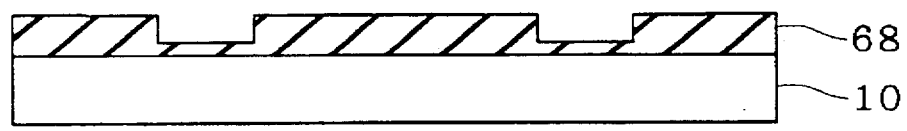
FIG. 35 is a sectional view showing the first method for manufacturing the SOI transistor according to the third embodiment of the present invention.

Then, an oxide film 68 is formed by using the selective oxidation method in which the silicon nitride film 66 and the resist 67 act as a mask (FIG. 35). The oxide film 68 has a concave portion in the region where the gate electrode should be formed.

Figure 36:
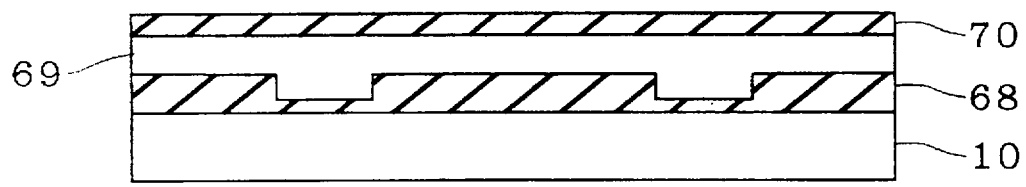
FIG. 36 is a sectional view showing the first method for manufacturing the SOI transistor according to the third embodiment of the present invention.
Figure 37:
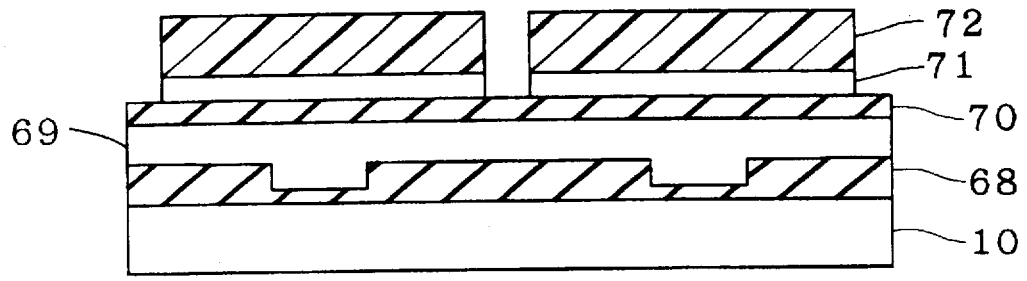
FIG. 37 is a sectional view showing the first method for manufacturing the SOI transistor according to the third embodiment of the present invention.

Thereafter, a SOI layer 69 is formed over the whole face. A silicone oxide film 70 is formed on the SOI layer 69 (FIG. 36). Subsequently, a silicon nitride film 71 having an opening only in a portion which should be field-isolated is formed on the silicon oxide film 70 by using the photolithographic technique. The silicon nitride film 71 is coated with a resist 72 (FIG. 37).

Figure 38:
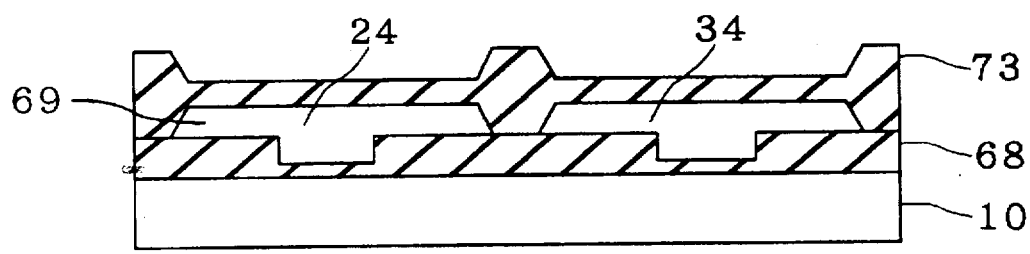
FIG. 38 is a sectional view showing the first method for manufacturing the SOI transistor according to the third embodiment of the present invention.

Next, a field oxide film 73 is formed by using the selective oxidation method in which the silicon nitride film 71 and the resist 72 act as a mask (FIG. 38). In this case, the SOI layer 69 is divided into SOI layers 34 and 24.

Figure 39:
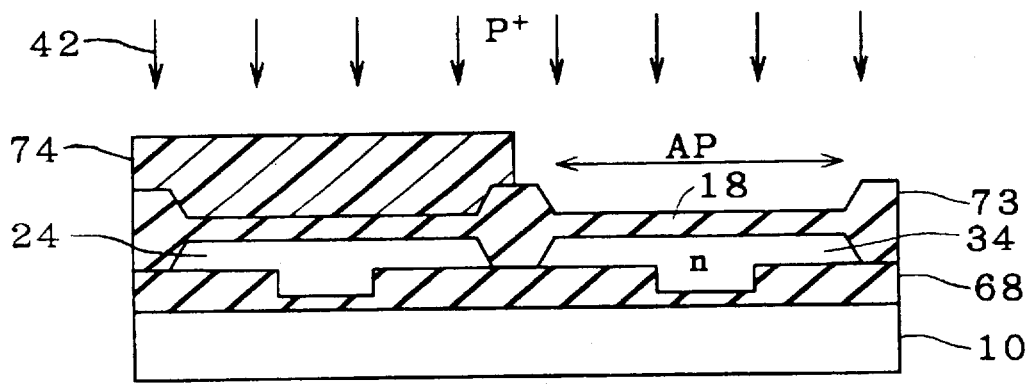
FIG. 39 is a sectional view showing the first method for manufacturing the SOI transistor according to the third embodiment of the present invention.
Figure 40:
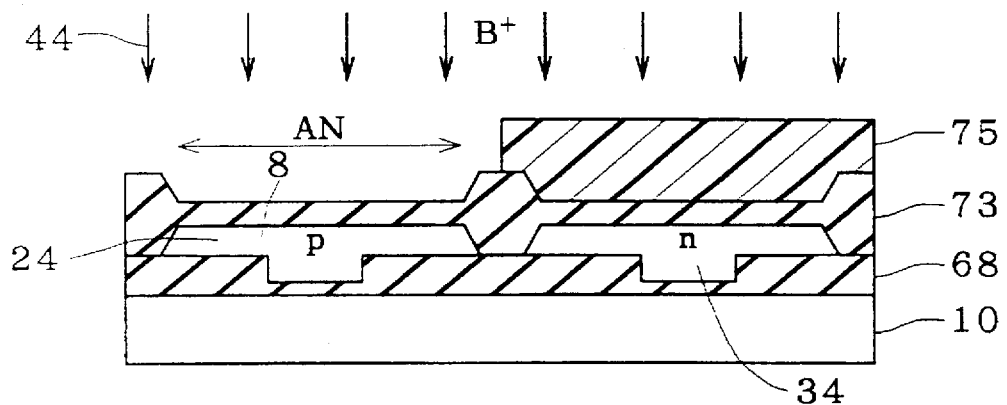
FIG. 40 is a sectional view showing the first method for manufacturing the SOI transistor according to the third embodiment of the present invention.

Subsequently, a resist 74 is applied so as to open a PMOS transistor formation region AP by using the photolithographic technique. Then, phosphorus 42 is implanted to form a channel region 18 of the PMOS transistor (FIG. 39). Similarly, a resist 75 is applied so as to open an NMOS transistor formation region AN by using the photolithographic technique. Then, boron 44 is implanted to form a channel region 8 of the NMOS transistor (FIG. 40).

Figure 41:
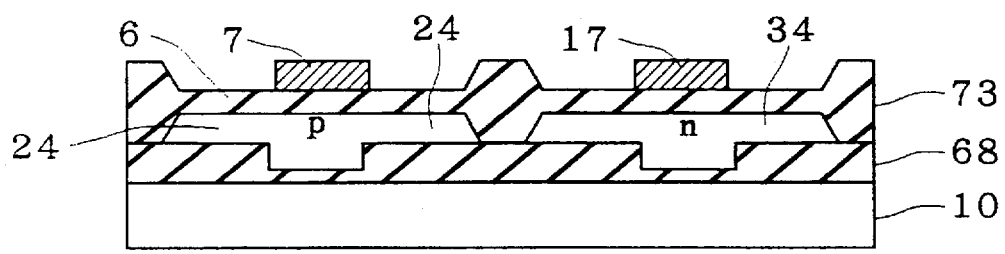
FIG. 41 is a sectional view showing the first method for manufacturing the SOI transistor according to the third embodiment of the present invention.

By using the photolithographic technique, gate electrodes 17 and 7 are then formed of polysilicon, for example (FIG. 41). Oxide films formed under the gate electrodes 17 and 7 are defined as gate oxide films 16 and 6. A mask which is used for the photolithography to form the resist 67 at the step shown in FIG. 34 described above is utilized for the photolithography to form the gate electrodes 17 and 7.

Figure 42:
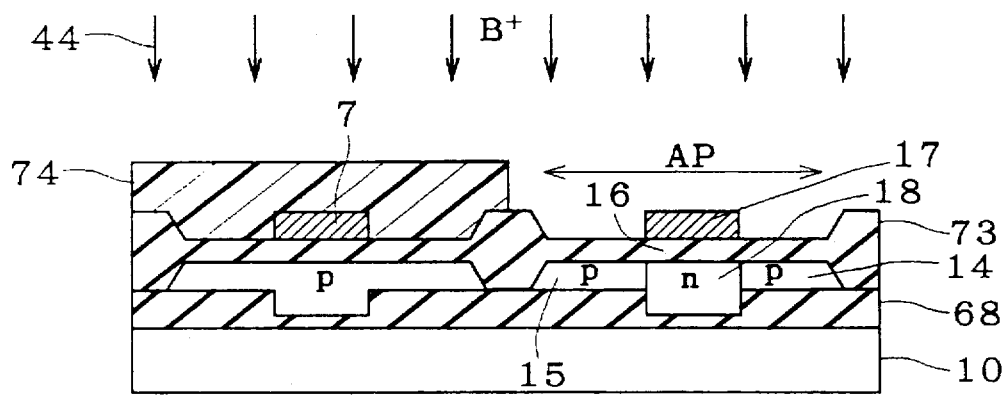
FIG. 42 is a sectional view showing the first method for manufacturing the SOI transistor according to the third embodiment of the present invention.

Subsequently, a resist 74 is applied so as to open the PMOS transistor formation region AP by using the photolithographic technique. Then, the boron 44 is implanted to form a P type drain region 14 and a P type source region 15 of the PMOS transistor. In this case, the gate electrode 17 acts as a mask so that the implantation of the boron 44 into the channel region 18 is blocked (FIG. 42).

Figure 43:
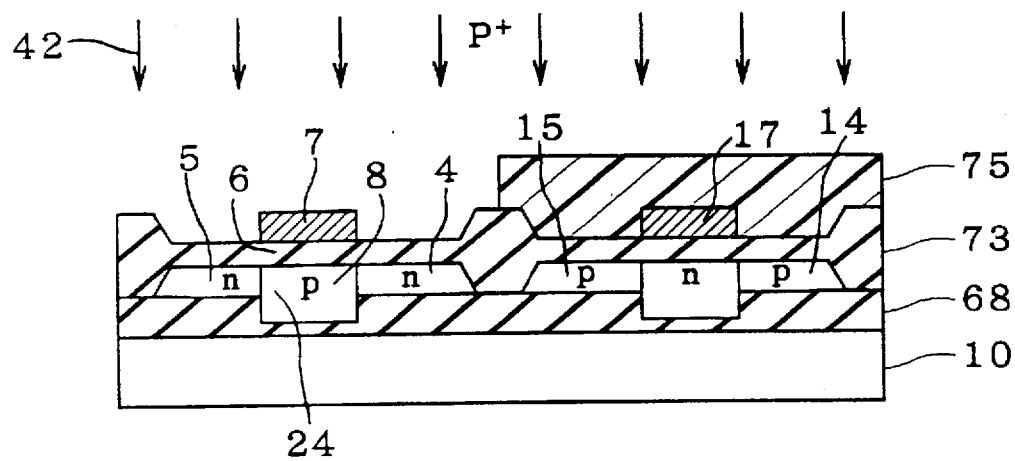
FIG. 43 is a sectional view showing the first method for manufacturing the SOI transistor according to the third embodiment of the present invention.

In the same way, a resist 75 is applied so as to open the NMOS transistor formation region AN by using the photolithographic technique. Then, the phosphorus 42 is implanted to form an N type drain region 4 and an N type source region 5 of the NMOS transistor. In this case, the gate electrode 7 acts as a mask so that the implantation of the phosphorus 42 into the channel region 8 is blocked (FIG. 43).

Figure 44:
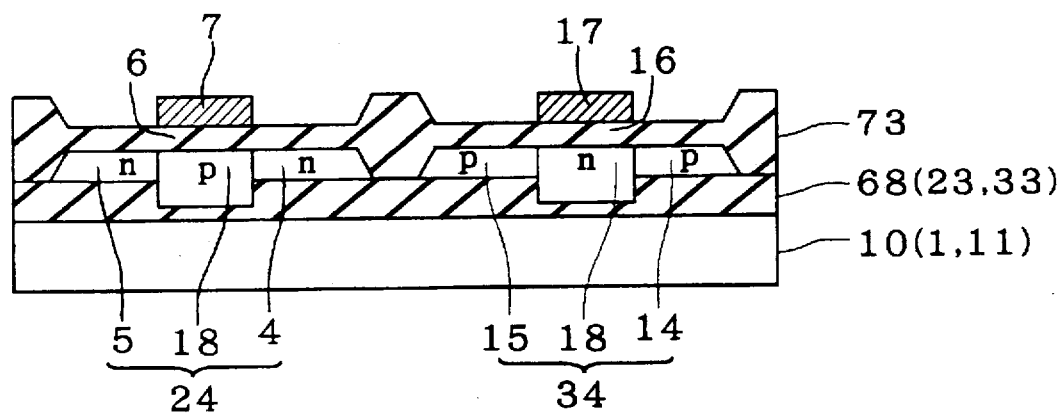
FIG. 44 is a sectional view showing the first method for manufacturing the SOI transistor according to the third embodiment of the present invention.

As a result of the above-mentioned steps, the SOI transistors having NMOS and PMOS structures shown in FIGS. 31 and 32 can be manufactured as shown in FIG. 44.

<Second Manufacturing Method>

FIGS. 45 to 56 are sectional views showing a second method for manufacturing SOI transistors (PMOS and NMOS transistors) according to the third embodiment.

Figure 45:
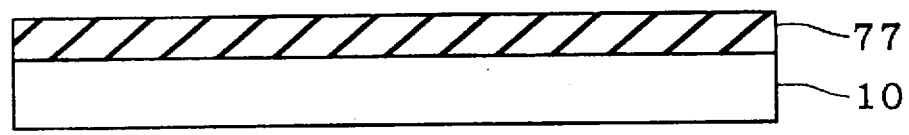
FIG. 45 is a sectional view showing a second method for manufacturing the SOI transistor according to the third embodiment of the present invention.
Figure 46:
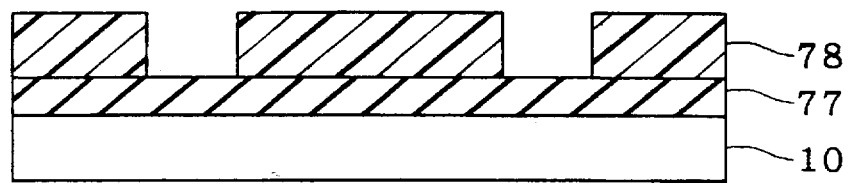
FIG. 46 is a sectional view showing the second method for manufacturing the SOI transistor according to the third embodiment of the present invention.

First of all, a silicon oxide film 77 is formed on a silicon substrate 10 by the thermal oxidation method or the like (FIG. 45). Then, the silicon oxide film 77 is coated with a resist 78 except for a region in which a gate electrode should be formed (FIG. 46). A mask which is used for the photolithography to form the resist 78 is utilized at the step of forming a gate electrode as an after-step. Consequently, it is possible to use a mask for the photolithography to form a gate electrode necessary for the steps of manufacturing a SOI transistor according to the prior art.

Figure 47:
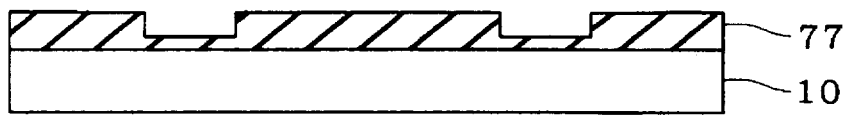
FIG. 47 is a sectional view showing the second method for manufacturing the SOI transistor according to the third embodiment of the present invention.

Then, the resist 78 is used as a mask to etch only the region in which the gate electrode of the silicon oxide film 77 should be formed. In this case, etching is performed so as to have such a small thickness that tunnel effect fully occurs (FIG. 47). As a result, the silicon oxide film 77 has a concave portion in the region where the gate electrode should be formed.

Figure 48:
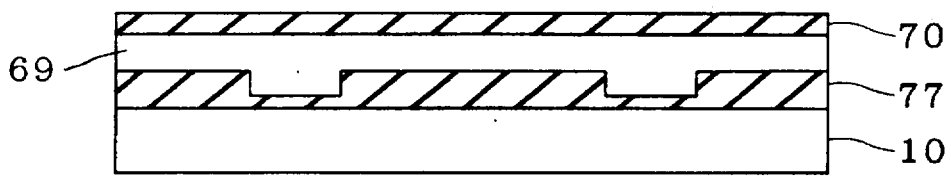
FIG. 48 is a sectional view showing the second method for manufacturing the SOI transistor according to the third embodiment of the present invention.
Figure 49:
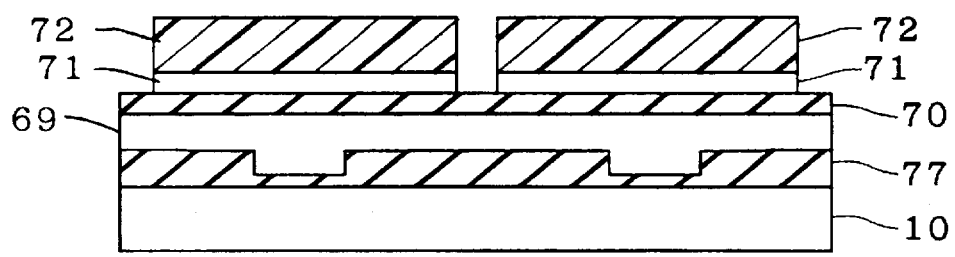
FIG. 49 is a sectional view showing the second method for manufacturing the SOI transistor according to the third embodiment of the present invention.

Thereafter, a SOI layer 69 is formed over the whole face. A silicon oxide film 70 is formed on the SOI layer 69 (FIG. 48). Subsequently, a silicon nitride film 71 having an opening only in a portion which should be field-isolated is formed on the silicon oxide film 70 by using the photolithographic technique. The silicon nitride film 71 is coated with a resist 72 (FIG. 49).

Figure 50:
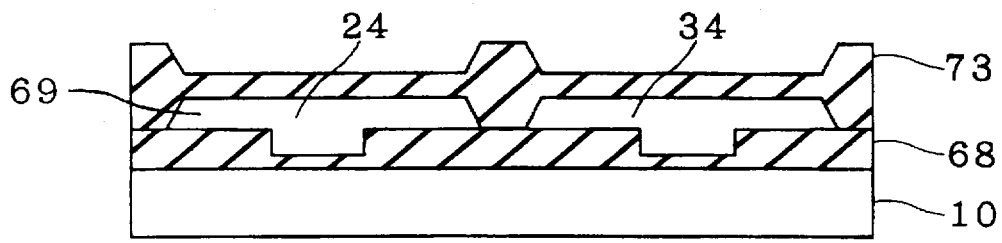
FIG. 50 is a sectional view showing the second method for manufacturing the SOI transistor according to the third embodiment of the present invention.

Next, a field oxide film 73 is formed by using the selective oxidation method in which the silicon nitride film 71 and the resist 72 act as a mask (FIG. 50). In this case, the SOI layer 69 is divided into SOI layers 34 and 24.

Figure 51:
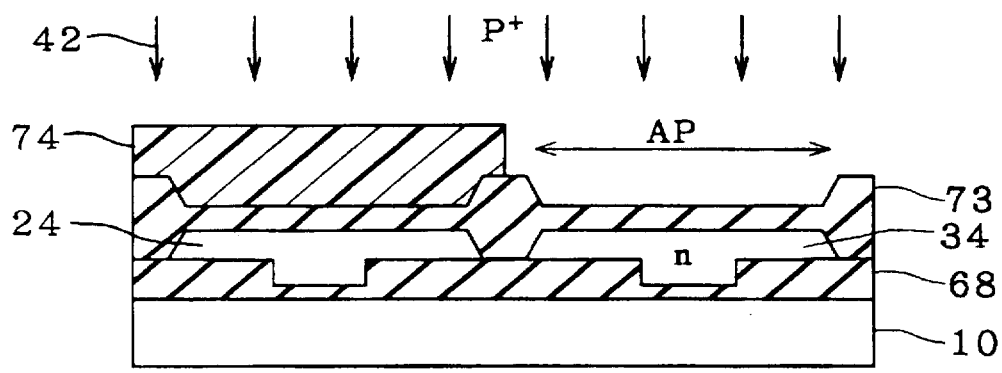
FIG. 51 is a sectional view showing the second method for manufacturing the SOI transistor according to the third embodiment of the present invention.
Figure 52:
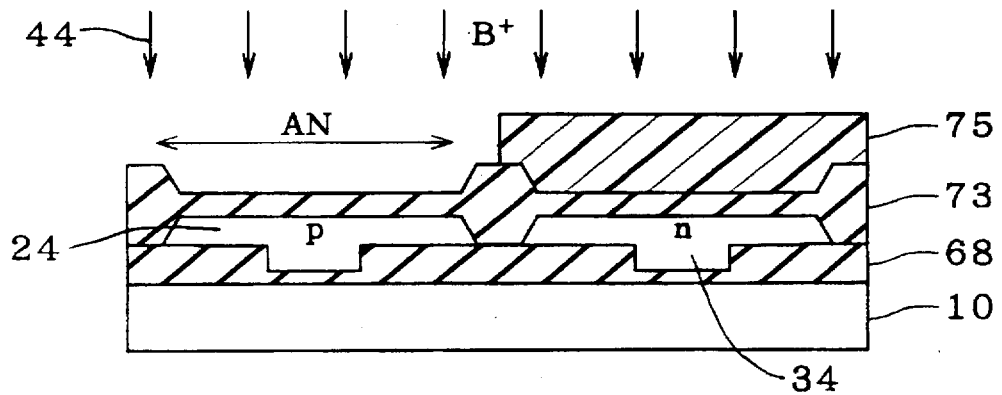
FIG. 52 is a sectional view showing the second method for manufacturing the SOI transistor according to the third embodiment of the present invention.

Subsequently, a resist 74 is applied so as to open a PMOS transistor formation region AP by using the photolithographic technique. Then, phosphorus 42 is implanted to form a channel region 18 of the PMOS transistor (FIG. 51). Similarly, a resist 75 is applied so as to open an NMOS transistor formation region AN by using the photolithographic technique. Then, boron 44 is implanted to form a channel region 8 of the NMOS transistor (FIG. 52).

Figure 53:
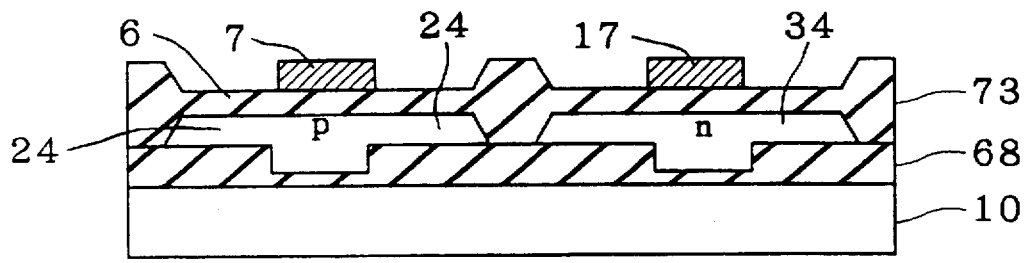
FIG. 53 is a sectional view showing the second method for manufacturing the SOI transistor according to the third embodiment of the present invention.

By using the photolithographic technique, gate electrodes 17 and 7 are then formed of polysilicon, for example (FIG. 53). Oxide films formed under the gate electrodes 17 and 7 are defined as gate oxide films 16 and 6. A mask which is used for the photolithography to form the resist 78 at the step shown in FIG. 46 described above is utilized for the photolithography to form the gate electrodes 17 and 7.

Figure 54:
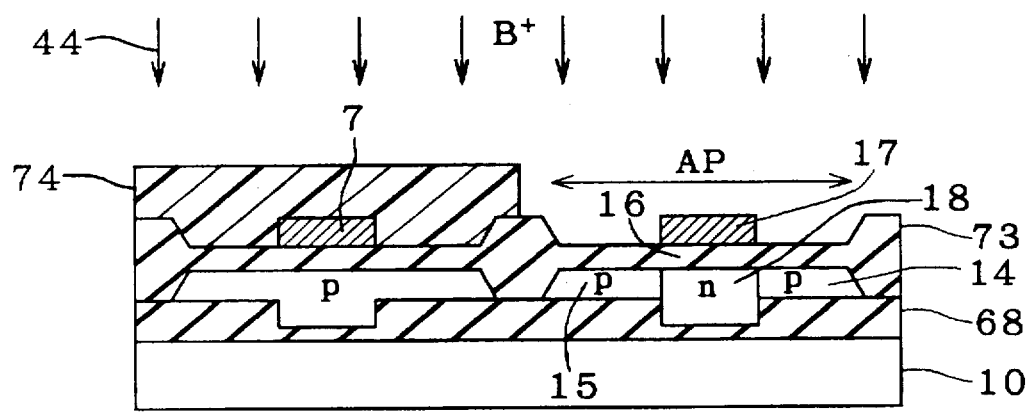
FIG. 54 is a sectional view showing the second method for manufacturing the SOI transistor according to the third embodiment of the present invention.

Subsequently, a resist 76 is applied so as to open the PMOS transistor formation region AP by using the photolithographic technique. Then, the boron 44 is implanted to form a P type drain region 14 and a P type source region 15 of the PMOS transistor. In this case, the gate electrode 17 acts as a mask so that the implantation of the boron 44 into the channel region 18 is blocked (FIG. 54).

Figure 55:
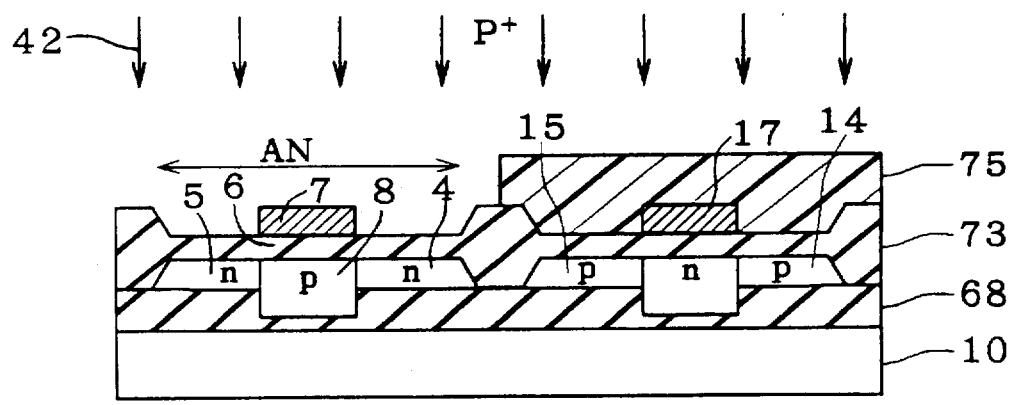
FIG. 55 is a sectional view showing the second method for manufacturing the SOI transistor according to the third embodiment of the present invention.

In the same way, a resist 75 is applied so as to open the NMOS transistor formation region AN by using the photolithographic technique. Then, the phosphorus 42 is implanted to form an N type drain region 4 and an N type source region 5 of the NMOS transistor. In this case, the gate electrode 7 acts as a mask so that the implantation of the phosphorus 42 into the channel region 8 is blocked (FIG. 55).

Figure 56:
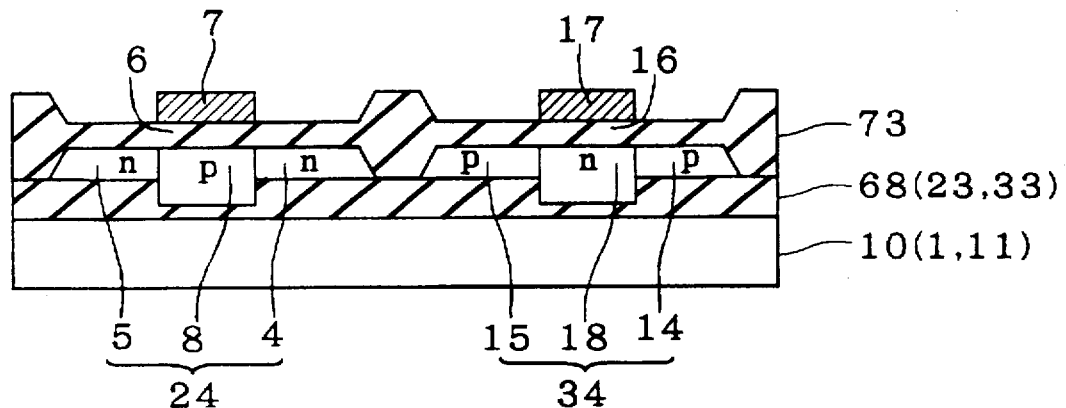
FIG. 56 is a sectional view showing the second method for manufacturing the SOI transistor according to the third embodiment of the present invention.

As a result of the above-mentioned steps, the SOI transistors having NMOS and PMOS structures shown in FIGS. 31 and 32 can be manufactured as shown in FIG. 56.

<<Fourth Embodiment>>
<NMOS Structure>

Figure 57:
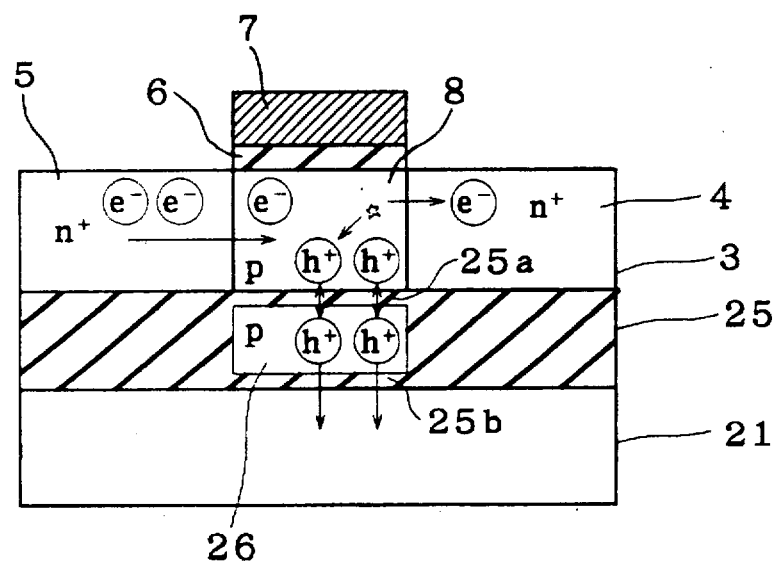
FIG. 57 is a sectional view showing the structure of an N type SOI transistor according to a fourth embodiment of the present invention.

FIG. 57 is a sectional view showing a SOI transistor having an NMOS structure according to a fourth embodiment of the present invention. As shown in FIG. 57, an embedded oxide film 25 is formed on a silicon layer 21, and a SOI layer 3 is formed on the embedded oxide film 25. An N type drain region 4 and an N type source region 5 are selectively formed on the surface of the SOI layer 3. A gate electrode 7 is formed above the SOI layer 3 which is provided between the N type drain region 4 and the N type source region 5. A gate oxide film 6 is disposed between the gate electrode 7 and the SOI layer 3. The surface of the SOI layer 3 provided below the gate electrode 7 is defined as a channel region 8.

Unlike the structure according to the prior art, a hole charge layer 26 made of a P type silicon layer is formed in a region, which is placed below the gate electrode 7, in the embedded oxide film 25 of an N type SOI transistor according to the fourth embodiment. A first thin film oxide region 25a of the embedded oxide film 25 formed between the SOI layer 3 and the hole charge layer 26 has such a small thickness that tunnel effect fully occurs. A second thin film oxide region 25b of the embedded oxide film 25 formed between the silicon layer 21 and the hole charge layer 26 has such a small thickness that the tunnel effect fully occurs. The plane shape and position of the gate electrode 7 conform to those of the hole charge layer 26.

According to such a structure, the potential of the silicon layer 21 (a negative potential against the potential of the gate electrode 7) is set such that the tunnel effect fully occurs in the embedded oxide film 25 formed between the SOI layer 3 and the hole charge layer 26. Consequently, holes generated in the vicinity of the N type drain region 4 due to ionization by collision are not charged in the channel region 8 but can be drained into the hole charge layer 26 by the tunnel effect. Furthermore, the potential of the silicon layer 21 is dropped and set such that the tunnel effect fully occurs in the embedded oxide film 25 formed between the silicon layer 21 and the hole charge layer 26. Consequently, the holes drained into the hole charge layer 26 can be drained into the silicon layer 21 through the embedded oxide film 25. As a result, a feedforward loop can be surely prevented from occurring due to the ionization by collision. Thus, excellent voltage/current characteristics can be obtained between source/drain electrodes so that a deterioration in the breakdown voltage of the transistor can be prevented. A structure in which the holes are drained downward does not damage integration.

Furthermore, the potential (high potential) of the silicon layer 21 is set such that the tunnel effect fully occurs in the embedded oxide film 25 from the hole charge layer 26 to the SOI layer 3 with the holes drained into the embedded oxide film 25. Consequently, the holes of the hole charge layer 26 can be returned to the channel region 8 so that charges (carriers) can be reused to reduce the consumed power.

In addition, the channel region 8 is completely brought into the floating state by the embedded oxide film 25. Consequently, a bad influence is not caused by back gate effect (substrate bias effect). Furthermore, the gate capacity of the transistor (a value obtained by connecting, in series, the capacities of the gate oxide film 6, a depletion layer provided below the gate electrode 7, and the embedded oxide film 25) is decreased. Consequently, high-speed properties can be kept as transistor characteristics.

<PMOS Structure>

FIG. 58 is a sectional view showing a SOI transistor having a PMOS structure according to the fourth embodiment of the present invention. As shown in FIG. 58, an embedded oxide film 35 is formed on a silicon layer 31, and a SOI layer 13 is formed on the embedded oxide film 35. A P type drain region 14 and a P type source region 15 are selectively formed on the surface of the SOI layer 13. A gate electrode 17 is formed above the SOI layer 13 which is provided between the P type drain region 14 and the P type source region 15. A gate oxide film 16 is disposed between the gate electrode 17 and the SOI layer 13. The surface of the SOI layer 13 provided below the gate electrode 17 is defined as a channel region 18.

Unlike the structure according to the prior art, an electron charge layer 36 made of an N type silicon layer is formed in a region, which is placed below the gate electrode 17, in the embedded oxide film 35 of a P type SOI transistor according to the fourth embodiment. A first thin film oxide region 35a of the embedded oxide film 35 formed between the SOI layer 13 and the electron charge layer 36 has such a small thickness that the tunnel effect fully occurs. A second thin film oxide region 35b of the embedded oxide film 35 formed between the silicon layer 31 and the electron charge layer 36 has such a small thickness that the tunnel effect fully occurs. The plane position and shape of the gate electrode 17 conform to those of the electron charge layer 36.

According to such a structure, the potential of the silicon layer 31 (a high potential against the potential of the gate electrode 17) is set such that the tunnel effect fully occurs in the embedded oxide film 35 formed between the SOI layer 13 and the electron charge layer 36. Consequently, electrons generated in the vicinity of the N type drain region 14 due to ionization by collision are not charged in the channel region 18 but can be drained into the electron charge layer 36 by the tunnel effect. Furthermore, the potential of the silicon layer 31 is raised and set such that the tunnel effect fully occurs in the embedded oxide film 35 formed between the silicon layer 31 and the electron charge layer 36. Consequently, the electrons drained into the electron charge layer 36 can be drained into the silicon layer 31 through the embedded oxide film 35. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. A structure in which the electrons are drained downward does not damage integration.

Furthermore, the potential (negative potential) of the silicon layer 31 is set such that the tunnel effect fully occurs in the embedded oxide film 35 from the electron charge layer 36 to the SOI layer 13 with the electrons drained into the embedded oxide film 35. Consequently, the electrons of the electron charge layer 36 can be returned to the channel region 18 so that charges can be reused to reduce the consumed power.

In addition, the channel region 18 is completely brought into the floating state by the embedded oxide film 35. Consequently, a bad influence is not caused by back gate effect (substrate bias effect). Furthermore, the gate capacity of the transistor (a value obtained by connecting, in series, the capacities of the gate oxide film 16, a depletion layer provided below the gate electrode 17, and the embedded oxide film 35) is decreased. Thus, high-speed properties can be kept as transistor characteristics.

<Manufacturing Method>

FIGS. 59 to 70 are sectional views showing a method for manufacturing SOI transistors (PMOS and NMOS transistors) according to the fourth embodiment.

First of all, a silicon oxide film 79 having such a small thickness that the tunnel effect fully occurs is formed on a silicon substrate 10 (FIG. 59). Then, an N type silicon layer 80 for the formation of the PMOS transistor and a P type silicon layer 81 for the formation of the NMOS transistor are formed in regions on the silicon oxide film 79 where gate electrodes should be formed, respectively (FIG. 60). A mask which is used for the photolithography to form the N type silicon layer 80 and the P type silicon layer 81 is utilized for the photolithography at the step of forming a gate electrode as an after-step. Consequently, it is possible to use a mask for the photolithography to form a gate electrode necessary for the steps of manufacturing a SOI transistor according to the prior art.

Figure 61:
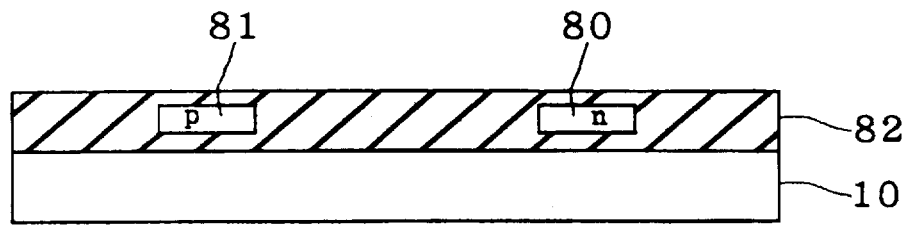
FIG. 61 is a sectional view showing the method for manufacturing the SOI transistor according to the fourth embodiment of the present invention.

Then, a silicon oxide film is formed over the whole face. Thus, a silicon oxide film 82 which completely covers the N type silicon layer 80 and the P type silicon layer 81 is obtained (FIG. 61). In this case, the silicon oxide film 82 formed on the N type silicon layer 80 and the P type silicon layer 81 has such a small thickness that the tunnel effect fully occurs.

Figure 62:
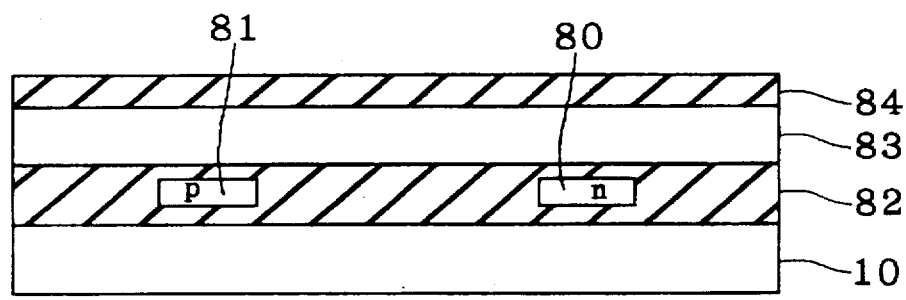
FIG. 62 is a sectional view showing the method for manufacturing the SOI transistor according to the fourth embodiment of the present invention.
Figure 63:
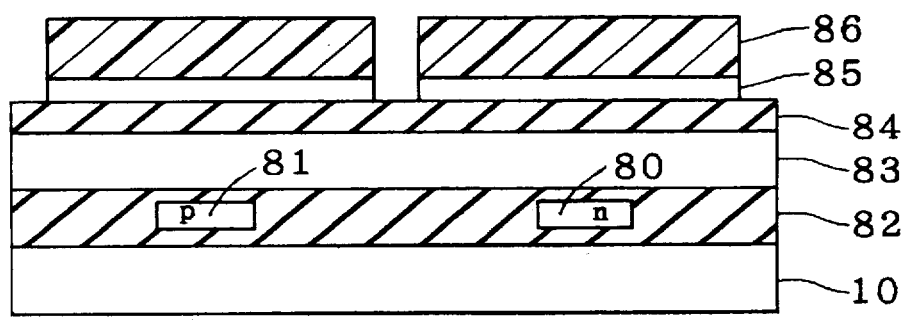
FIG. 63 is a sectional view showing the method for manufacturing the SOI transistor according to the fourth embodiment of the present invention.

Thereafter, a SOI layer 83 is formed over the whole face. A silicon oxide film 84 is formed on the SOI layer 83 (FIG. 62). Subsequently, a silicon nitride film 85 having an opening only in a portion which should be field-isolated is formed on the silicon oxide film 84 by using the photolithographic technique. The silicon nitride film 85 is coated with a resist 86 (FIG. 63).

Figure 64:
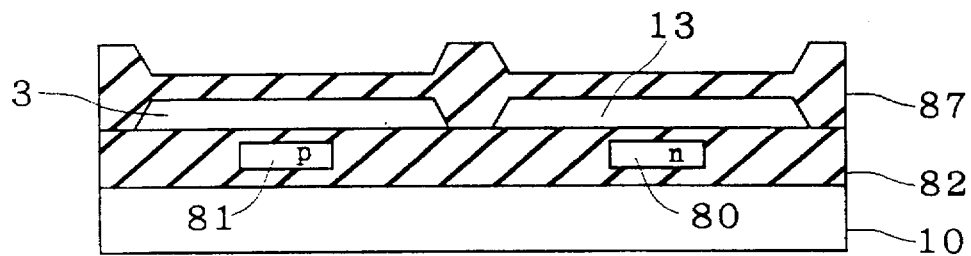
FIG. 64 is a sectional view showing the method for manufacturing the SOI transistor according to the fourth embodiment of the present invention.

Next, a field oxide film 87 is formed by using the selective oxidation method in which the silicon nitride film 85 and the resist 86 act as a mask (FIG. 64). In this case, the SOI layer 83 is divided into SOI layers 13 and 3.

Figure 65:
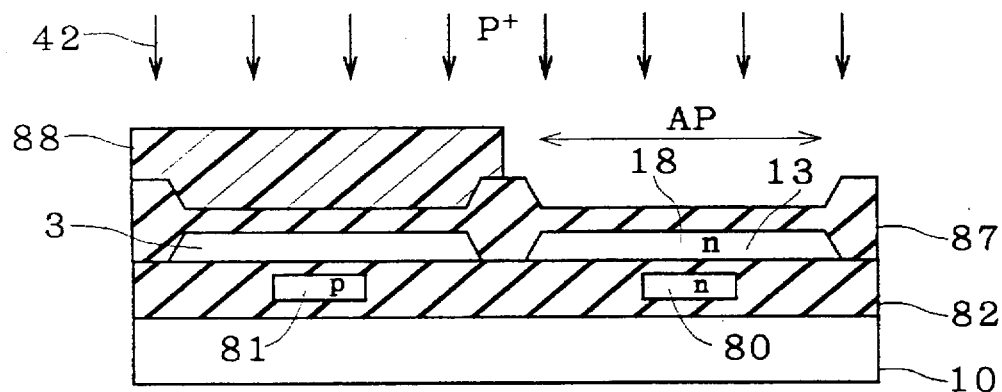
FIG. 65 is a sectional view showing the method for manufacturing the SOI transistor according to the fourth embodiment of the present invention.
Figure 66:
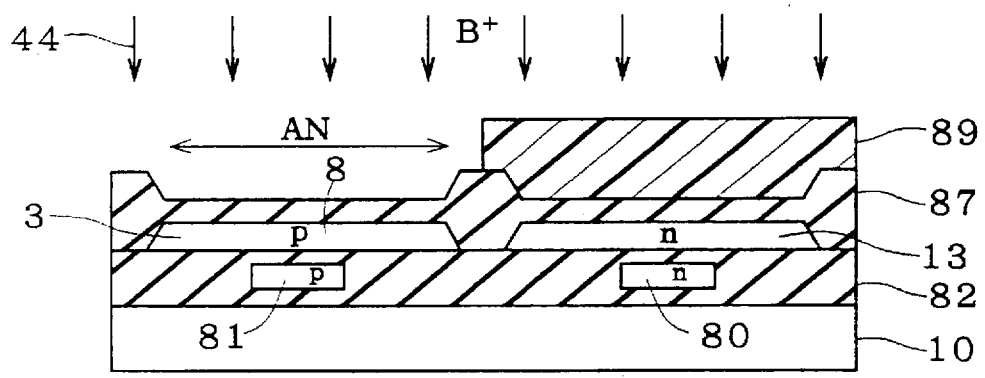
FIG. 66 is a sectional view showing the method for manufacturing the SOI transistor according to the fourth embodiment of the present invention.

Subsequently, a resist 88 is applied so as to open a PMOS transistor formation region AP by using the photolithographic technique. Then, phosphorus 42 is implanted to form a channel region 18 of the PMOS transistor (FIG. 65). Similarly, a resist 89 is applied so as to open an NMOS transistor formation region AN by using the photolithographic technique. Then, boron 44 is implanted to form a channel region 8 of the NMOS transistor (FIG. 66).

Figure 67:
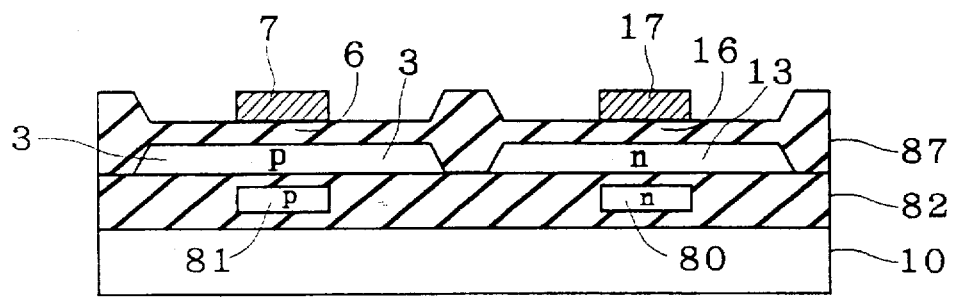
FIG. 67 is a sectional view showing the method for manufacturing the SOI transistor according to the fourth embodiment of the present invention.

By using the photolithographic technique, gate electrodes 17 and 7 are then formed of polysilicon, for example (FIG. 67). Oxide films formed under the gate electrodes 17 and 7 are defined as gate oxide films 16 and 6. A mask which is used for the photolithography to form the N type silicon layer 80 and the P type silicon layer 81 at the step shown in FIG. 60 described above is utilized for the photolithography to form the gate electrodes 17 and 7.

Figure 68:
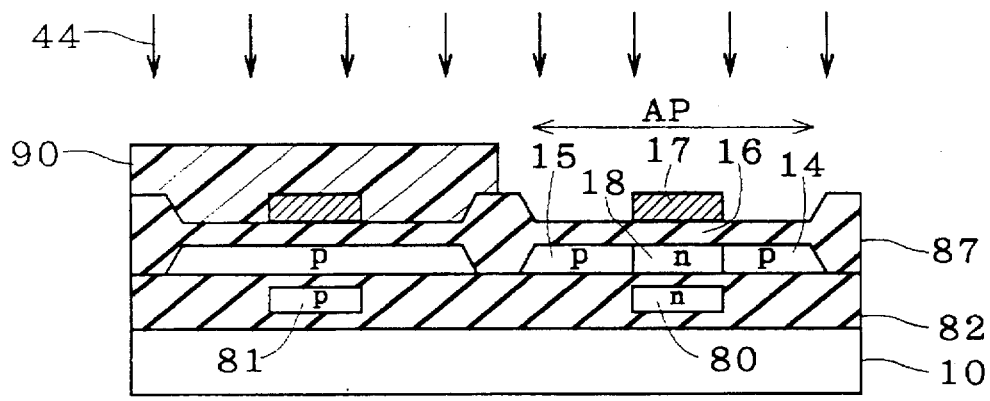
FIG. 68 is a sectional view showing the method for manufacturing the SOI transistor according to the fourth embodiment of the present invention.

Subsequently, a resist 90 is applied so as to open the PMOS transistor formation region AP by using the photolithographic technique. Then, the boron 44 is implanted to form a P type drain region 14 and a P type source region 15 of the PMOS transistor (FIG. 68). In this case, the gate electrode 17 acts as a mask so that the implantation of the boron 44 into the channel region 18 provided below the gate electrode 17 is blocked.

Figure 69:
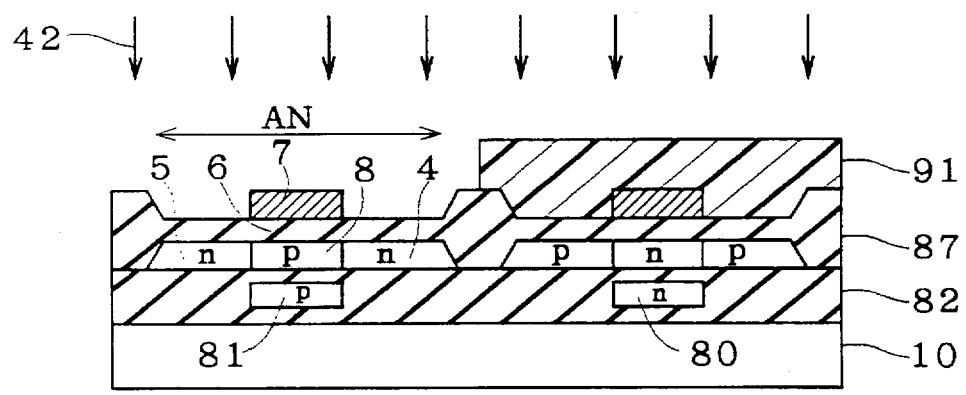
FIG. 69 is a sectional view showing the method for manufacturing the SOI transistor according to the fourth embodiment of the present invention.

In the same way, a resist 91 is applied so as to open the NMOS transistor formation region AN by using the photolithographic technique. Then, the phosphorus 42 is implanted to form an N type drain region 4 and an N type source region 5 of the NMOS transistor (FIG. 69). In this case, the gate electrode 7 acts as a mask so that the implantation of the phosphorus 42 into the channel region 8 provided below the gate electrode 7 is blocked.

Figure 70:
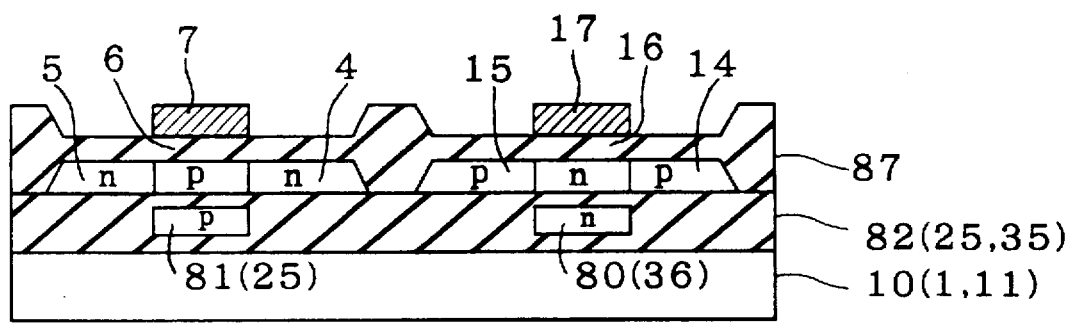
FIG. 70 is a sectional view showing the method for manufacturing the SOI transistor according to the fourth embodiment of the present invention.

As a result of the above-mentioned steps, the SOI transistors having NMOS and PMOS structures shown in FIGS. 57 and 58 can be manufactured as shown in FIG. 70.

<Logical Circuit>

Figure 91A:
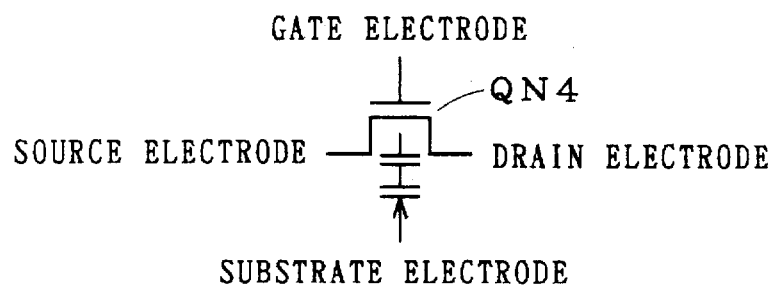
FIGS. 91(a) and 91(b) are circuit diagrams of the SOI transistor according to the fourth embodiment of the present invention.
Figure 91B:
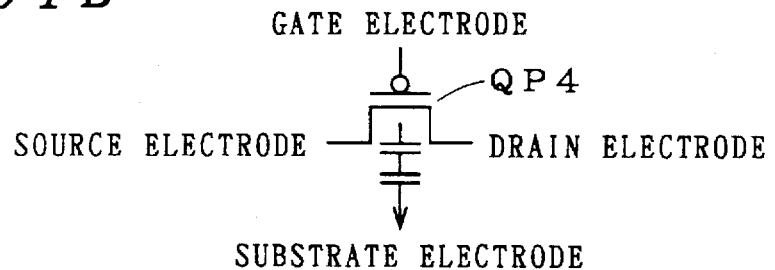

The NMOS transistor (having the structure of FIG. 57) according to the fourth embodiment is shown by a circuit diagram of FIG. 91(a), and the PMOS transistor (having the structure of FIG. 58) according to the fourth embodiment is shown by a circuit diagram of FIG. 91(b).

Figure 92:
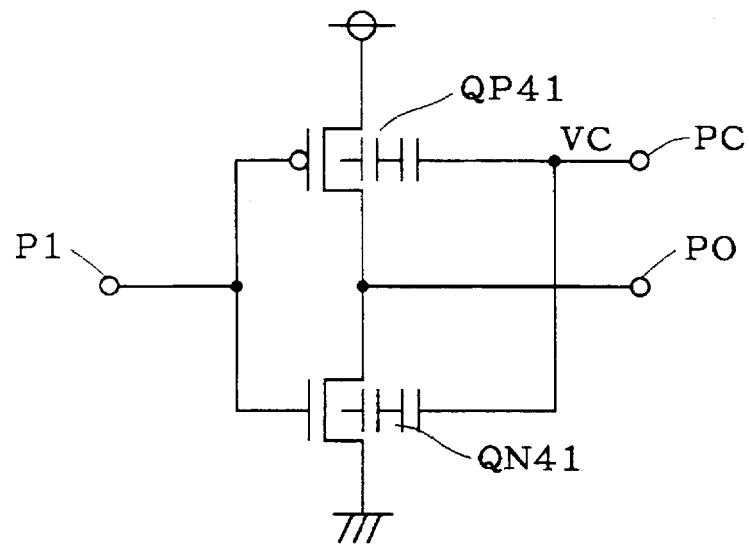
FIG. 92 is a diagram showing an inverter circuit formed by the SOI transistor according to the fourth embodiment of the present invention.

FIG. 92 is a diagram showing an inverter circuit formed by the SOI transistor according to the fourth embodiment. As shown in FIG. 92, the source of a PMOS transistor QP41 is connected to a power source VDD, the drain of an NMOS transistor QN41 is connected to the drain of the PMOS transistor QP41, and the source of the NMOS transistor QN41 is grounded to a GND level. The substrate potential of the PMOS transistor QP41 (the potential of the silicon layer 31) and the substrate potential of the NMOS transistor QN41 (the potential of the silicon layer 21) are set to a control voltage VC obtained from a control terminal PC. The gates of the PMOS transistor QP41 and NMOS transistor QN41 are connected to an input terminal P1. The drains of the PMOS transistor QP41 and NMOS transistor QN41 are connected to an output terminal PO in common.

According to such a structure, an inverter circuit in which a signal sent from the input terminal P1 is logically inverted and output to the output terminal PO can be formed.

In this case, the control voltage VC is set to such a negative voltage that the tunnel effect fully occurs in the embedded oxide film 25 provided between the SOI layer 3 and the hole charge layer 26 of the NMOS transistor QN41. Consequently, holes charged in the channel region 8 of the NMOS transistor QN41 can be drained into the hole charge layer 26. Furthermore, the control voltage VC is dropped and set to such a negative voltage that the tunnel effect fully occurs in the embedded oxide film 25 provided between the hole charge layer 26 and the silicon layer 21 of the NMOS transistor QN41. Consequently, holes charged in the hole charge layer 26 of the NMOS transistor QN41 can be drained into the silicon layer 21. In addition, the holes charged in the hole charge layer 26 can be returned to the channel region 8 by setting the control voltage VC to a high potential.

For example, the control voltage VC is normally set to the GND level, and is periodically set to a negative potential so that the holes can be drained into the hole charge layer 26 or the silicon layer 21. In addition, the control voltage VC is set to a high potential so that the holes charged in the hole charge layer 26 can be returned to the channel region 8.

Similarly, the control voltage VC is set to such a high voltage that the tunnel effect fully occurs in the embedded oxide film 35 provided between the SOI layer 13 and the electron charge layer 36 of the PMOS transistor QP41. Consequently, electrons charged in the channel region 18 of the PMOS transistor QP41 can be drained into the electron charge layer 36. Furthermore, the control voltage VC is raised and set to such a high voltage that the tunnel effect fully occurs in the embedded oxide film 35 provided between the electron charge layer 36 and the silicon layer 31 of the PMOS transistor QP41. Consequently, electrons charged in the electron charge layer 36 of the PMOS transistor QP41 can be drained into the silicon layer 31. In addition, the control voltage VC is set to a negative potential so that the electrons charged in the electron charge layer 36 can also be returned to the channel region 18.

For example, the control voltage VC is normally set to a power source VDD level, and is periodically set to a high potential so that the electrons can be drained into the electron charge layer 36 or the silicon layer 31. In addition, the control voltage VC is set to a high potential so that the electrons charged in the electron charge layer 36 can be returned to the channel region 18.

An inverter circuit having excellent breakdown voltage properties can be obtained by the control voltage VC.

Figure 93:
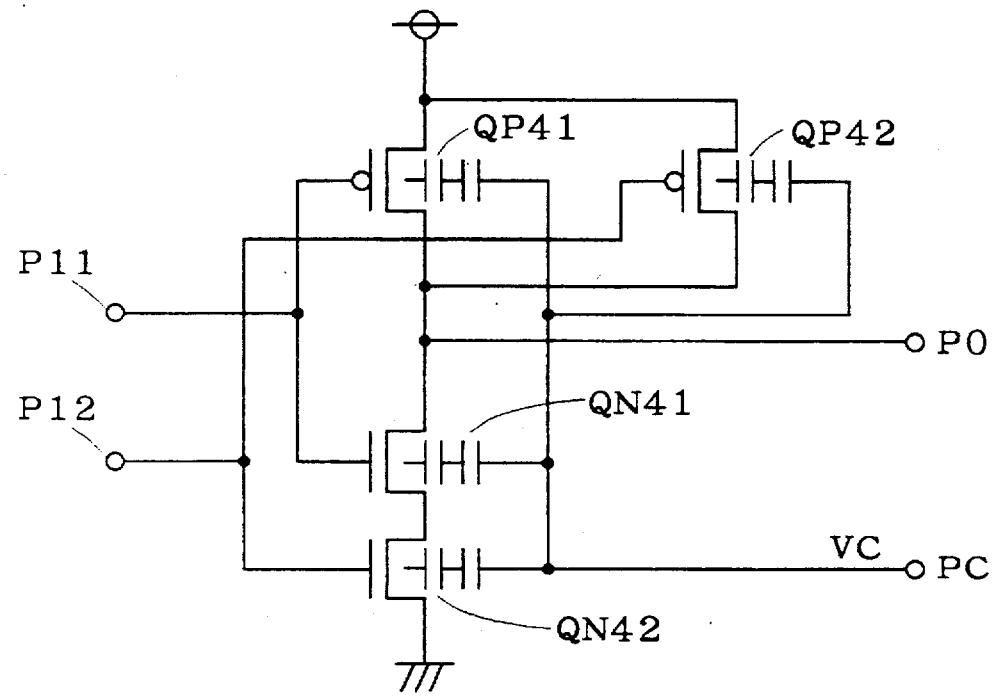
FIG. 93 is a diagram showing a NAND circuit formed by the SOI transistor according the fourth embodiment of the present invention.

FIG. 93 is a diagram showing an NAND gate circuit formed by the SOI transistor according to the fourth embodiment. As shown in FIG. 93, the sources of PMOS transistors QP41 and QP42 are connected to a power source VDD in common, the drain of an NMOS transistor QN41 is connected to the drains of the PMOS transistors QP41 and QP42, the drain of an NMOS transistor QN42 is connected to the source of the NMOS transistor QN41, and the source of the PMOS transistor QP42 is grounded to a GND level.

The substrate potentials of the PMOS transistors QP41 and QP42 and those of the NMOS transistors QN41 and QN42 are set to a control voltage VC obtained from a control terminal PC. The gates of the PMOS transistor QP41 and NMOS transistor QN41 are connected to an input terminal P11. The gates of the PMOS transistor QP42 and NMOS transistor QN42 are connected to an input terminal P12. The drains of the PMOS transistors QP41 and QP42 and the drain of the NMOS transistor QN41 are connected to an output terminal PO in common.

According to such a structure, a NAND circuit in which the result of NAND operation of first and second signals sent from the input terminals P11 and P12 is output to the output terminal PO can be formed.

As described above, the holes charged in the channel regions 8 of the NMOS transistors QN41 and QN42 are drained into the hole charge layers 26 or the silicon layers 21, or the electrons charged in the channel regions 18 of the PMOS transistors QP41 and QP42 are drained into the electron charge layers 36 or the silicon layers 31 by the control voltage VC. Thus, a NAND circuit having excellent breakdown voltage properties can be obtained.

<<Fifth Embodiment>>
<NMOS Structure>

Figure 71:
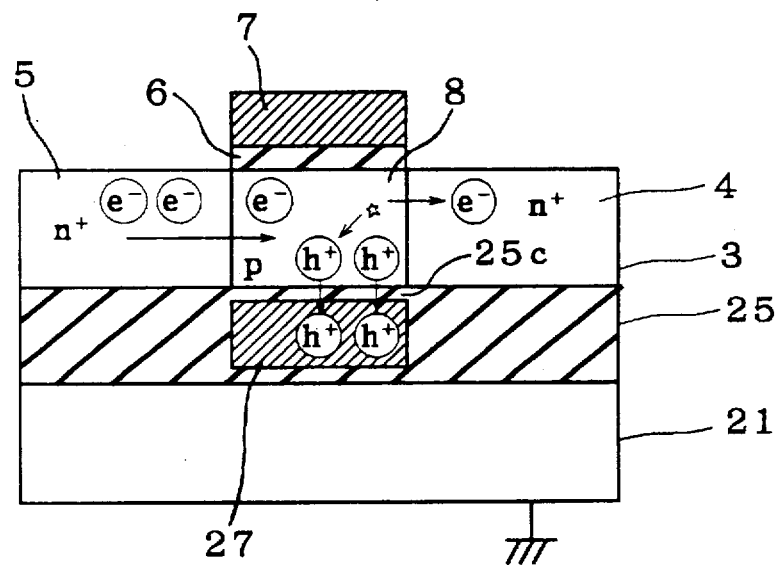
FIG. 71 is a sectional view showing the structure of an N type SOI transistor according to a fifth embodiment of the present invention.

FIG. 71 is a sectional view showing a SOI transistor having an NMOS structure according to a fifth embodiment of the present invention. As shown in FIG. 71, an embedded oxide film 25 is formed on a silicon layer 21 grounded to a GND level, and a SOI layer 3 is formed on the embedded oxide film 25. An N type drain region 4 and an N type source region 5 are selectively formed on the surface of the SOI layer 3. A gate electrode 7 is formed above the SOI layer 3 which is provided between the N type drain region 4 and the N type source region 5. A gate oxide film 6 is disposed between the gate electrode 7 and the SOI layer 3. The surface of the SOI layer 3 provided below the gate electrode 7 is defined as a channel region 8.

Unlike the structure according to the prior art, a second gate electrode 27 is formed in a region, which is placed below the gate electrode 7, in the embedded oxide film 25 of an N type SOI transistor according to the fifth embodiment. A thin film oxide region 25c of the embedded oxide film 25 provided between the SOI layer 3 and the second gate electrode 27 has such a small thickness that tunnel effect fully occurs. The plane shape and position of the gate electrode 7 conform to those of the second gate electrode 27.

According to such a structure, the potential of the second gate electrode 27 (a negative potential against the potential of the gate electrode 7) is set such that the tunnel effect fully occurs in the embedded oxide film 25 provided between the SOI layer 3 and the second gate electrode 27. Consequently, holes generated in the vicinity of the N type drain region 4 due to ionization by collision are not charged in the channel region 8 but can be drained into the second gate electrode 27 by the tunnel effect. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. Furthermore, a structure in which the holes are drained downward does not damage integration.

In addition, the channel region 8 is completely brought into the floating state by the embedded oxide film 25. Consequently, a bad influence is not caused by back gate effect (substrate bias effect). Furthermore, the gate capacity of the transistor (a value obtained by connecting, in series, the capacities of the gate oxide film 6, a depletion layer provided below the gate electrode 7, and the embedded oxide film 25) is decreased. Consequently, high-speed properties can be kept as transistor characteristics.

<PMOS Structure>

Figure 72:
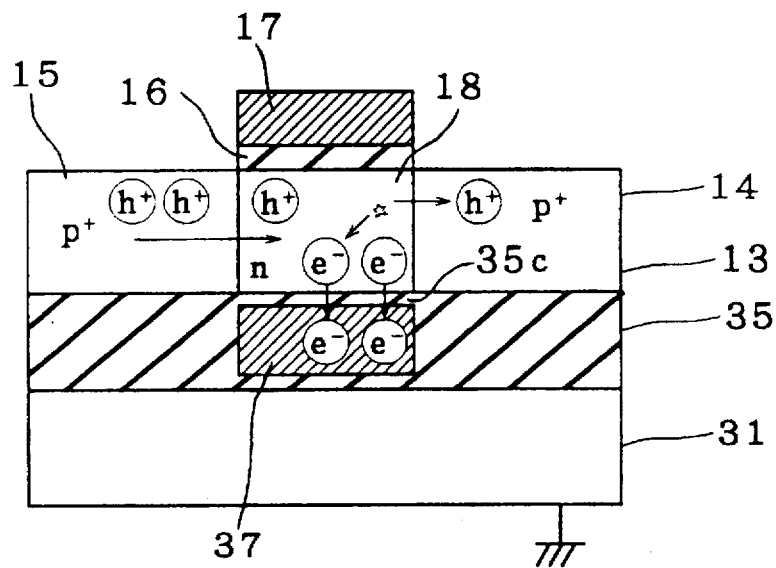
FIG. 72 is a sectional view showing the structure of a P type SOI transistor according to the fifth embodiment of the present invention.

FIG. 72 is a sectional view showing a SOI transistor having a PMOS structure according to the fifth embodiment of the present invention. As shown in FIG. 72, an embedded oxide film 35 is formed on a silicon layer 31 grounded to a GND level, and a SOI layer 13 is formed on the embedded oxide film 35. A P type drain region 14 and a P type source region 15 are selectively formed on the surface of the SOI layer 13. A gate electrode 17 is formed above the SOI layer 13 which is provided between the P type drain region 14 and the P type source region 15. A gate oxide film 16 is disposed between the gate electrode 17 and the SOI layer 13. The surface of the SOI layer 13 provided below the gate electrode 17 is defined as a channel region 18.

Unlike the structure according to the prior art, a second gate electrode 37 is formed in a region, which is placed below the gate electrode 17, in the embedded oxide film 35 of a P type SOI transistor according to the fifth embodiment. A thin film oxide region 35c of the embedded oxide film 35 formed between the SOI layer 13 and the second gate electrode 37 has such a small thickness that the tunnel effect fully occurs. The plane shape and position of the gate electrode 17 conform to those of the second gate electrode 37.

According to such a structure, the potential of the second gate electrode 37 (a high potential against the potential of the gate electrode 17) is set such that the tunnel effect fully occurs in the embedded oxide film 35 formed between the SOI layer 13 and the second gate electrode 37. Consequently, electrons generated in the vicinity of the N type drain region 14 due to ionization by collision are not charged in the channel region 18 but can be drained into the second gate electrode 37 by the tunnel effect. As a result, a feedforward loop can be surely prevented from occurring due to the ionization by collision. Thus, excellent voltage/current characteristics can be obtained between the source/drain electrodes so that a deterioration in the breakdown voltage of the transistor can be prevented. Furthermore, a structure in which the electrons are drained downward does not damage integration.

In addition, the channel region 18 is completely brought into the floating state by the embedded oxide film 35. Consequently, a bad influence is not caused by back gate effect (substrate bias effect). Furthermore, the gate capacity of the transistor (a value obtained by connecting, in series, the capacities of the gate oxide film 16, a depletion layer provided below the gate electrode 17, and the embedded oxide film 35) is decreased. Consequently, the high-speed properties can be kept as the transistor characteristics.

<Manufacturing Method>

FIGS. 73 to 84 are sectional views showing a method for manufacturing SOI transistors (PMOS and NMOS transistors) according to the fifth embodiment.

Figure 73:
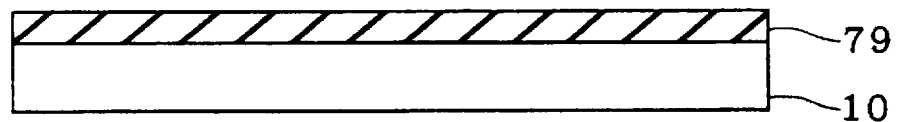
FIG. 73 is a sectional view showing a method for manufacturing the SOI transistor according to the fifth embodiment of the present invention.
Figure 74:
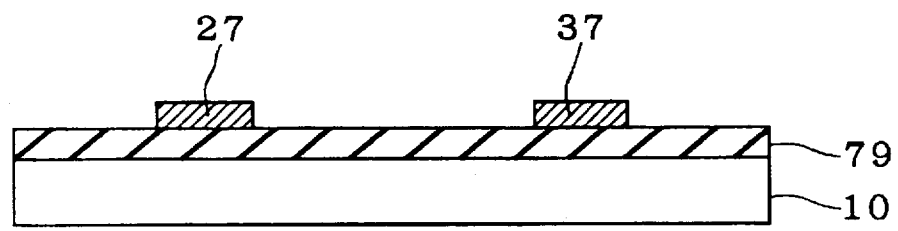
FIG. 74 is a sectional view showing the method for manufacturing the SOI transistor according to the fifth embodiment of the present invention.

First of all, a silicon oxide film 79 is formed on a silicon substrate 10 by the thermal oxidation method or the like (FIG. 73). Then, a second gate electrode 37 for the formation of the PMOS transistor and a second gate electrode 27 for the formation of the NMOS transistor are formed in regions on the silicon oxide film 79 where gate electrodes should be formed, respectively (FIG. 74). A mask which is used for the photolithography to form the second gate electrodes 37 and 27 is utilized for the photolithography at a step of forming a gate electrode as an after-step. Consequently, it is possible to use a mask for the photolithography to form a gate electrode necessary for the steps of manufacturing a SOI transistor according to the prior art.

Figure 75:
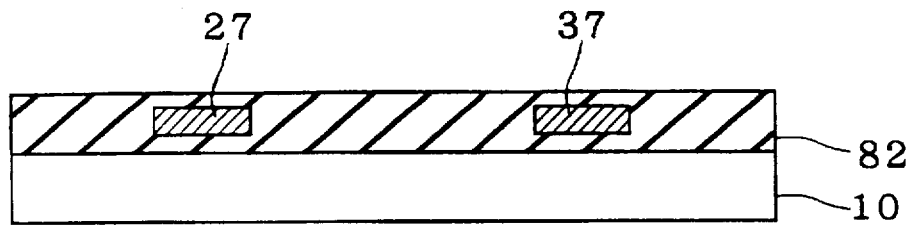
FIG. 75 is a sectional view showing the method for manufacturing the SOI transistor according to the fifth embodiment of the present invention.

Then, a silicon oxide film is formed over the whole face. Thus, a silicon oxide film 82 which completely covers the second gate electrodes 37 and 27 is obtained (FIG. 75). In this case, the silicon oxide film 82 formed on the second gate electrodes 37 and 27 has such a small thickness that the tunnel effect fully occurs.

Figure 76:
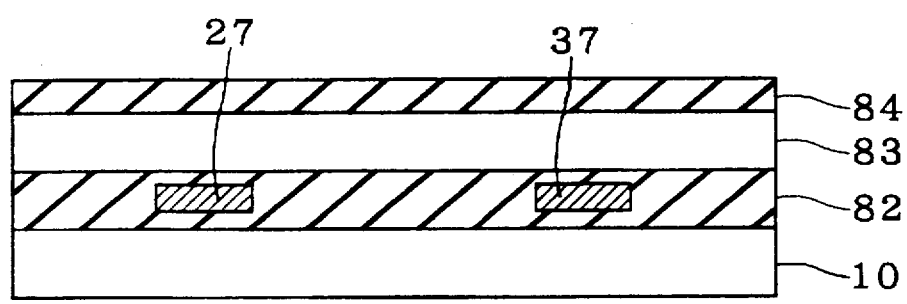
FIG. 76 is a sectional view showing the method for manufacturing the SOI transistor according to the fifth embodiment of the present invention.
Figure 77:
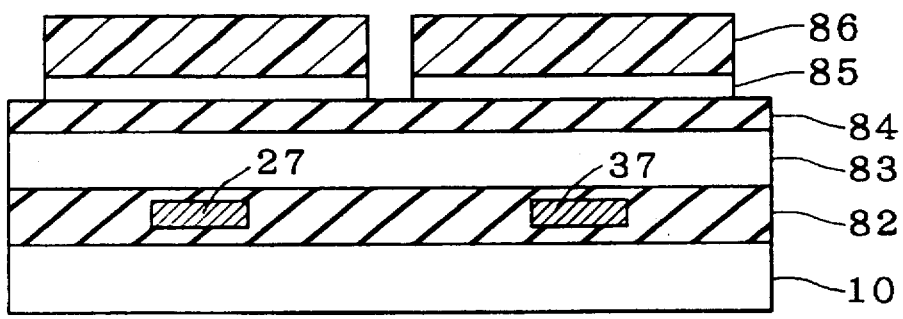
FIG. 77 is a sectional view showing the method for manufacturing the SOI transistor according to the fifth embodiment of the present invention.

Thereafter, a SOI layer 83 is formed over the whole face. A silicon oxide film 84 is formed on the SOI layer 83 (FIG. 76). Subsequently, a silicon nitride film 85 having an opening only in a portion which should he field-isolated is formed on the silicon oxide film 84 by using the photolithographic technique. The silicon nitride film 85 is coated with a resist 86 (FIG. 77).

Figure 78:
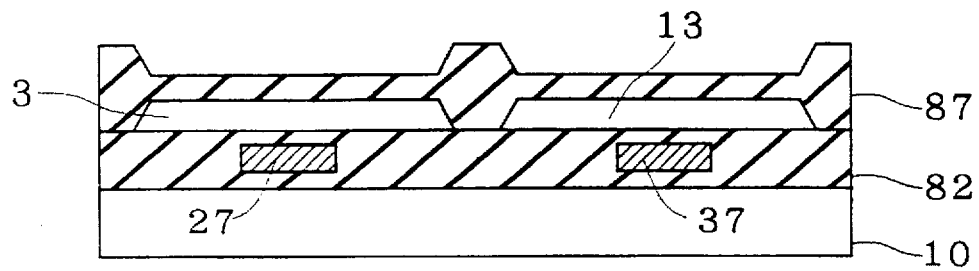
FIG. 78 is a sectional view showing the method for manufacturing the SOI transistor according to the fifth embodiment of the present invention.

Next, a field oxide film 87 is formed by using the selective oxidation method in which the silicon nitride film 85 and the resist 86 act as a mask (FIG. 78). In this case, the SOI layer 83 is divided into SOI layers 13 and 3.

Figure 79:
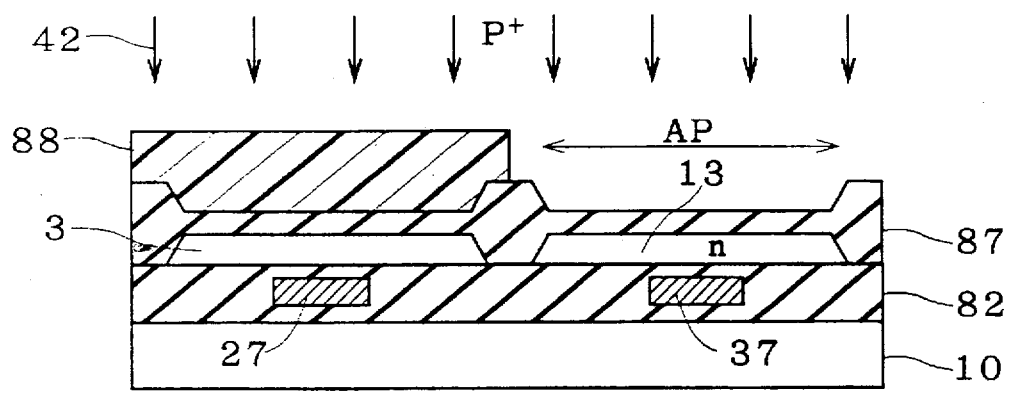
FIG. 79 is a sectional view showing the method for manufacturing the SOI transistor according to the fifth embodiment of the present invention.
Figure 80:
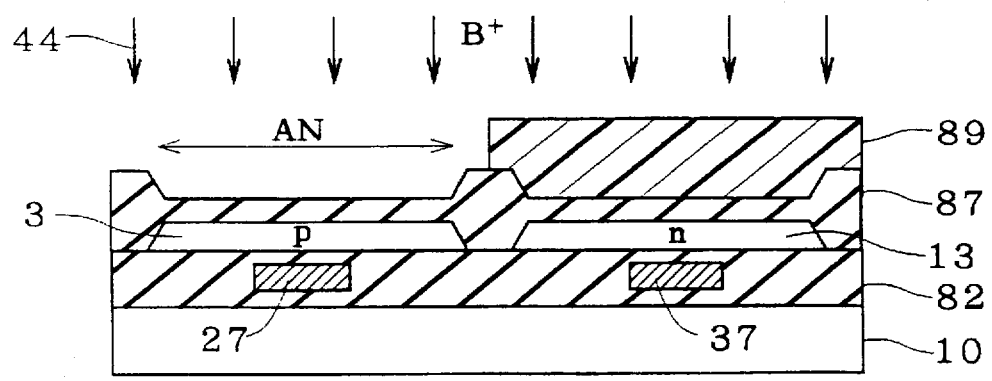
FIG. 80 is a sectional view showing the method for manufacturing the SOI transistor according to the fifth embodiment of the present invention.

Subsequently, a resist 88 is applied so as to open a PMOS transistor formation region AP by using the photolithographic technique. Then, phosphorus 42 is implanted to form a channel region 18 of the PMOS transistor (FIG. 79). Similarly, a resist 89 is applied so as to open an NMOS transistor formation region AN by using the photolithographic technique. Then, boron 44 is implanted to form a channel region 8 of the NMOS transistor (FIG. 80).

Figure 81:
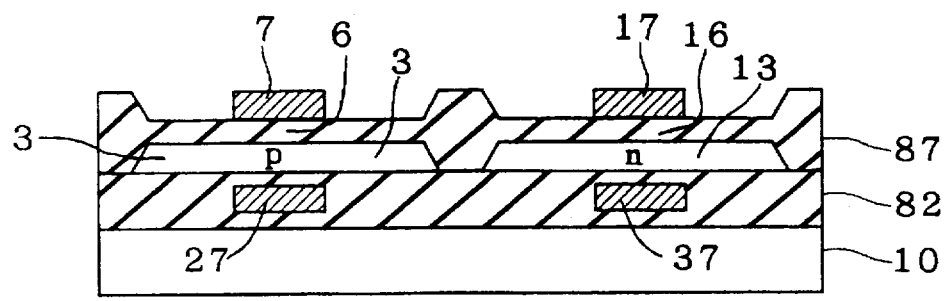
FIG. 81 is a sectional view showing the method for manufacturing the SOI transistor according to the fifth embodiment of the present invention.

By using the photolithographic technique, gate electrodes 17 and 7 are then formed of polysilicon, for example (FIG. 81). Oxide films formed under the gate electrodes 17 and 7 are defined as gate oxide films 16 and 6. A mask which is used for the photolithography to form the second gate electrodes 37 and 27 at the step shown in FIG. 74 described above is utilized for the photolithography to form the gate electrodes 17 and 7.

Figure 82:
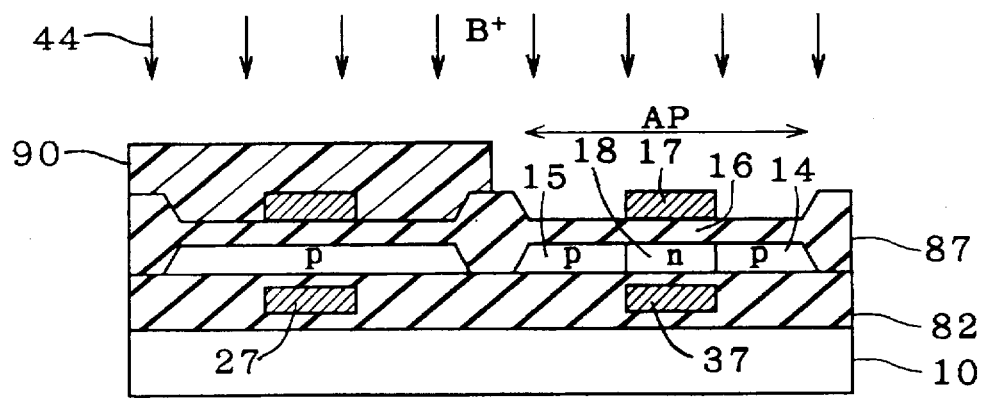
FIG. 82 is a sectional view showing the method for manufacturing the SOI transistor according to the fifth embodiment of the present invention.
Figure 83:
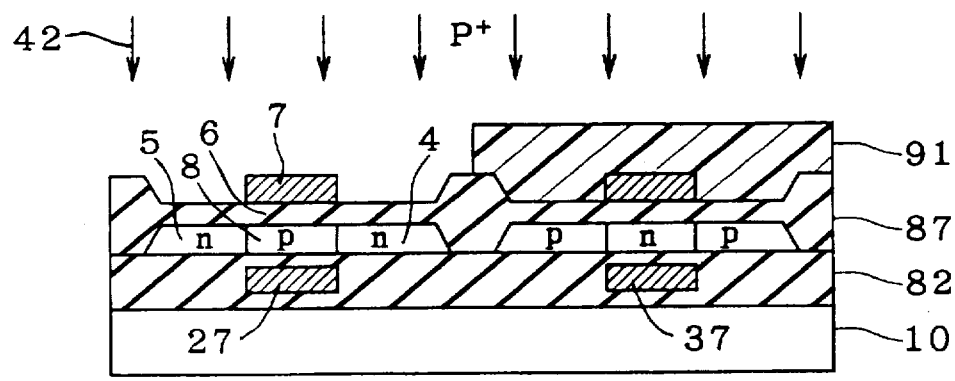
FIG. 83 is a sectional view showing the method for manufacturing the SOI transistor according to the fifth embodiment of the present invention.

Subsequently, a resist 90 is applied so as to open the PMOS transistor formation region AP by the photolithographic technique. Then, the boron 44 is implanted to form a P type drain region 14 and a P type source region 15 of the PMOS transistor (FIG. 82). In this case, the gate electrode 17 acts as a mask so that the implantation of the boron 44 into the channel region 18 provided below the gate electrode 17 is blocked. In the same way, a resist 91 is applied so as to open the NMOS transistor formation region AN by using the photolithographic technique. Then, the phosphorus 42 is implanted to form an N type drain region 4 and an N type source region 5 of the NMOS transistor (FIG. 83). In this case, the gate electrode 7 acts as a mask so that the implantation of the phosphorus 42 into the channel region 8 provided below the gate electrode 7 is blocked.

Figure 84:
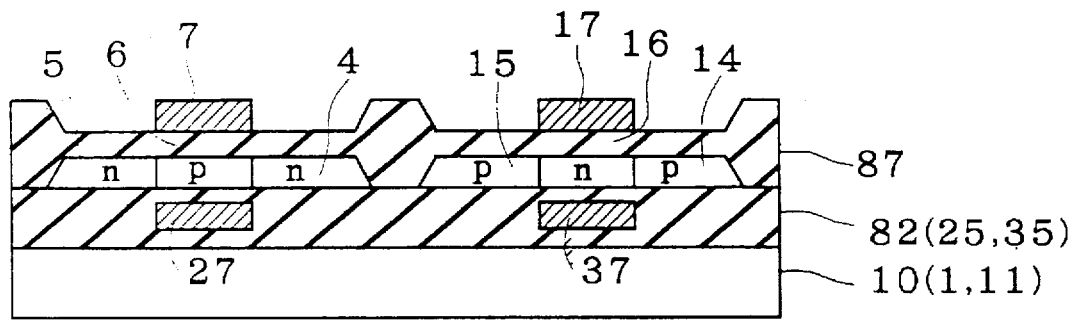
FIG. 84 is a sectional view showing the method for manufacturing the SOI transistor according to the fifth embodiment of the present invention.

As a result of the above-mentioned steps, the SOI transistors having NMOS and PMOS structures shown in FIGS. 71 and 72 can be manufactured as shown in FIG. 84.

<Logical Circuit>

Figure 94A:
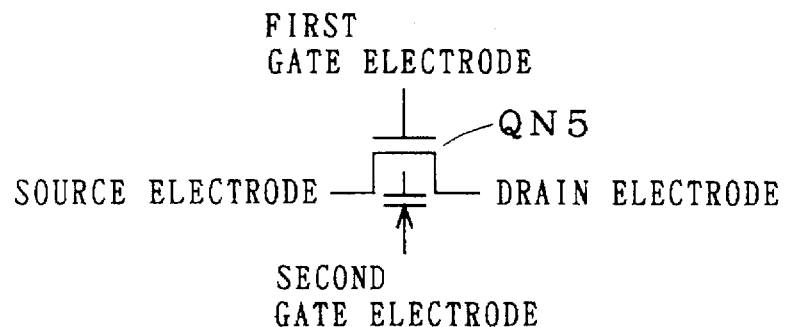
FIGS. 94(a) and 94(b) are circuit diagrams of the SOI transistor according to the fifth embodiment of the present invention.
Figure 94B:
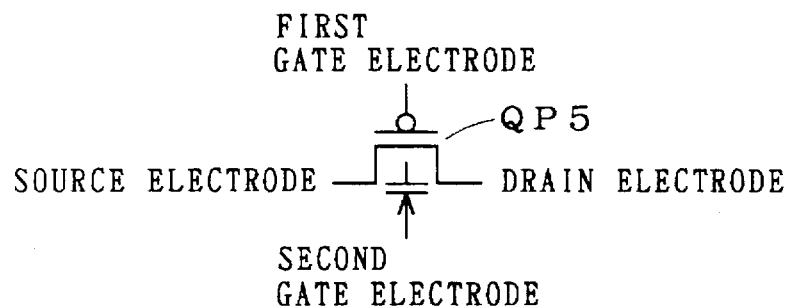

The NMOS transistor (having the structure of FIG. 71) according to the fifth embodiment is shown by a circuit diagram of FIG. 94(a), and the PMOS transistor (having the structure of FIG. 72) according to the fifth embodiment is shown by a circuit diagram of FIG. 94(b).

Figure 95:
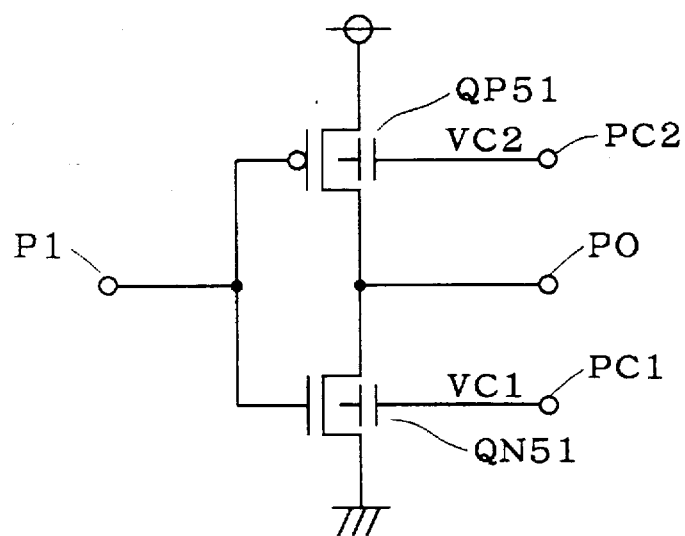
FIG. 95 is a diagram showing an inverter circuit formed by the SOI transistor according to the fifth embodiment of the present invention.

FIG. 95 is a diagram showing an inverter circuit formed by the SOI transistor according to the fifth embodiment. As shown in FIG. 95, the source of a PMOS transistor QP51 is connected to a power source VDD, the drain of an NMOS transistor QN51 is connected to the drain of the PMOS transistor QP51, and the source of the NMOS transistor QN51 is grounded to a GND level. The substrate potential of the NMOS transistor QN51 (the potential of the silicon layer 21) is set to a control voltage VC1 obtained from a control terminal PC1. The substrate potential of the PMOS transistor QP51 (the potential of the silicon layer 31) is set to a control voltage VC2 obtained from a control terminal PC2. The gates of the PMOS transistor QP51 and NMOS transistor QN51 are connected to an input terminal P1. The drains of the PMOS transistor QP51 and NMOS transistor QN51 are connected to an output terminal PO in common.

According to such a structure, an inverter circuit in which a signal sent from the input terminal P1 is logically inverted and output to the output terminal PO can be formed.

In this case, the control voltage VC1 is set to such a negative voltage that the tunnel effect fully occurs in the embedded oxide film 25 provided between the SOI layer 3 and the second gate electrode 27 of the NMOS transistor QN51. Consequently, holes charged in the channel region of the NMOS transistor QN51 can be drained into the second gate electrode 27.

For example, the control voltage VC1 is normally set to the GND level, and is periodically set to a negative potential so that the holes can be drained into the second gate electrode 27.

Similarly, the control voltage VC2 is set to such a high voltage that the tunnel effect fully occurs in the embedded oxide film 35 provided between the SOI layer 13 and the second gate electrode 37 of the PMOS transistor QP51. Consequently, electrons charged in the channel region 18 of the PMOS transistor QP51 can be drained into the second gate electrode 37.

For example, the control voltage VC2 is normally set to a power source VDD level, and is periodically set to a high potential such that the electrons can be drained into the second gate electrode 37.

An inverter circuit having excellent breakdown voltage properties can be obtained by the control voltage VC.

Figure 96:
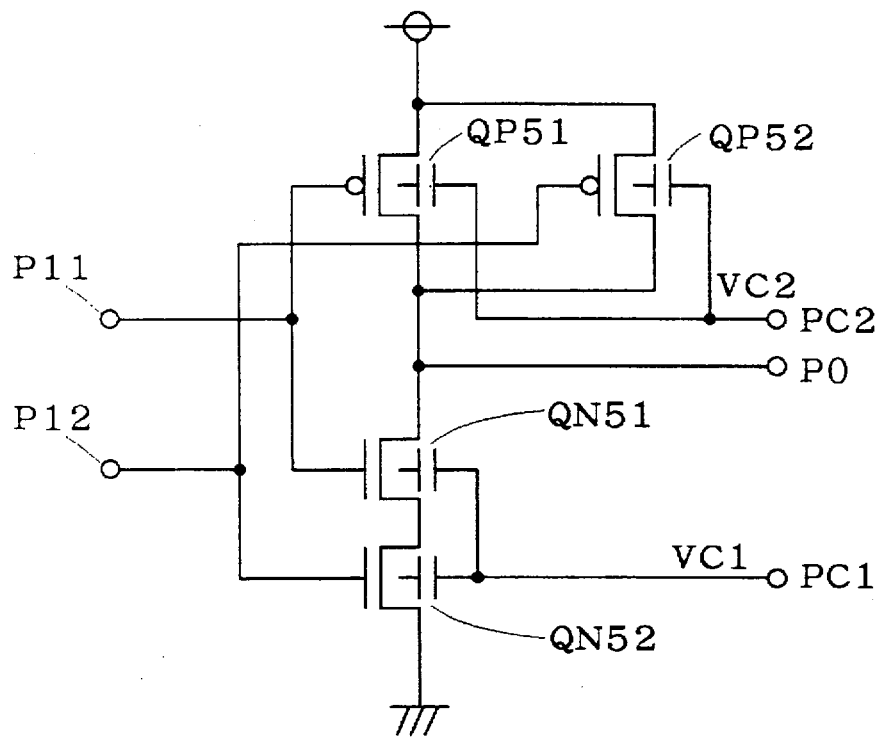
FIG. 96 is a diagram showing a NAND circuit formed by the SOI transistor according to the fifth embodiment of the present invention.
Figure 97:
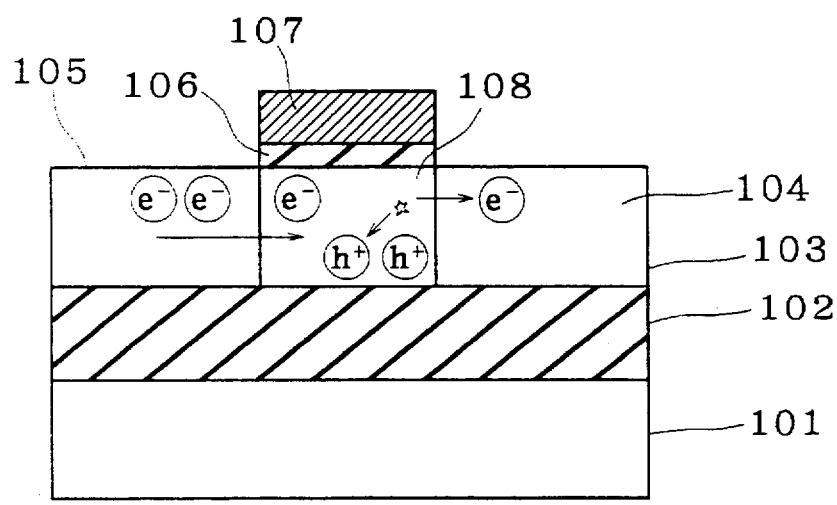
FIG. 97 is a sectional view showing the structure of an NMOS transistor formed on a SOI substrate according to the prior art.
Figure 98:
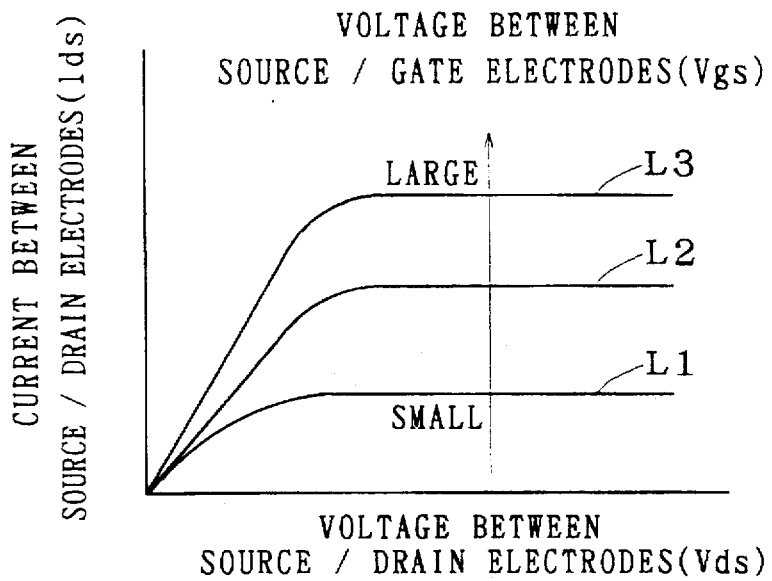
FIG. 98 is a graph showing Vds—Ids characteristics of a MOS transistor formed on a bulk silicon substrate.
Figure 99:
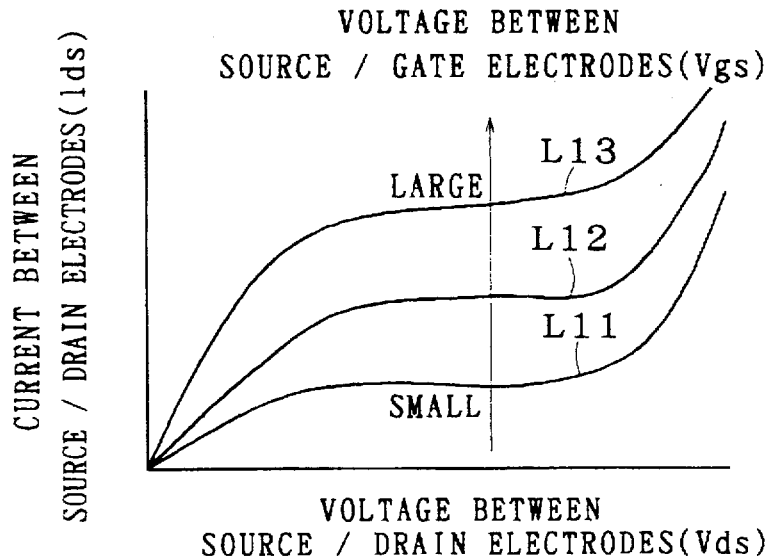
FIG. 99 is a graph showing Vds—Ids characteristics of a MOS transistor formed on the SOI substrate.

FIG. 96 is a diagram showing and NAND gate circuit formed by the SOI transistor according to the fifth embodiment. As shown in FIG. 96, the sources of PMOS transistors QP51 and QP52 are connected to a power source VDD in common, the drain of an NMOS transistor QN51 is connected to the drains of the PMOS transistors QP51 and QP52, the drain of an NMOS transistor QN52 is connected to the source of the NMOS transistor QN51, and the source of the PMOS transistor QP52 is grounded to a GND level.

The substrate potentials of the NMOS transistors QN51 and QN52 are set to a control voltage VC1 obtained from a control terminal PC1. The substrate potentials of the PMOS transistors QP51 and QP52 are set to a control voltage VC2 obtained from a control terminal PC2.

The gates of the PMOS transistor QP51 and NMOS transistor QN51 are connected to an input terminal P11. The gates of the PMOS transistor QP52 and NMOS transistor QN52 are connected to an input terminal P12. The drains of the PMOS transistors QP51 and QP52 and the drain of the NMOS transistor QN51 are connected to an output terminal PO in common.

According to such a structure, a NAND circuit in which the result of NAND operation of first and second signals sent from the input terminals P11 and P12 is output to the output terminal PO can be formed.

As described above, the holes charged in the channel regions 8 of the NMOS transistors QN51 and QN52 are drained into the second gate electrodes 27 by the control voltage VC1 or the electrons charged in the channel regions 18 of the PMOS transistors QP51 and QP52 are drained into the second gate electrodes 37 by the control voltage VC2. Thus, a NAND circuit having excellent breakdown voltage properties can be obtained.

While the invention has been described in detail, the foregoing description is in all aspects illustrative and not restrictive. It is understood that numerous other modifications and variations can be devised without departing from the scope of the invention.

We claim:

1. A semiconductor integrated circuit device, comprising:

a substrate;

an insulating layer formed on said substrate;

a semiconductor layer of a first conductivity type formed on said insulating layer;

first and second semiconductor regions of a second conductivity type selectively formed on an upper surface of said semiconductor layer;

a gate insulating film formed on said upper surface of said semiconductor layer between said first and second semiconductor regions;

a gate electrode formed on said gate insulating film;

wherein a portion of said semiconductor layer provided below said gate electrode includes a channel region of a transistor being formed by said gate electrode and said first and second semiconductor regions, and first carriers are flowing in the channel region from the first semiconductor region to the second semiconductor region; and wherein said insulating layer includes a carrier drainable region below said gate electrode, the carrier drainable region being capable of draining second carriers having a charge opposite to that of the first carriers from said channel region, said second carriers arising while said first carriers and flowing in said channel region.

2. The semiconductor integrated circuit device as defined in claim 1, wherein said carrier drainable region includes a thin insulating layer region having a reduced thickness compared to the remainder of the insulating layer such that said second carriers can move between the semiconductor layer and said substrate by tunneling through the thin insulating layer region.

3. A semiconductor integrated circuit device as defined in claim 2, wherein said thin insulating layer region is formed on a side of the insulating layer adjacent to the semiconductor layer.

4. The semiconductor integrated circuit device as defined in claim 2, wherein said thin insulating layer region is formed on a side of the insulating layer adjacent to the substrate.

5. The semiconductor integrated circuit device as defined in claim 1, wherein said carrier drainable region includes:

a carrier charge layer formed in the insulating layer;

a first thin insulating layer region provided between said carrier charge layer and said channel region, said first thin insulating layer region having a thickness that permits charged carrier movement from said channel region to said carrier charge layer by charged carrier tunneling; and a second thin insulating layer region provided between said carrier charge layer and said substrate, said second thin insulating layer region having a thickness that permits charged carrier movement from said carrier charge layer to said substrate by charged carrier tunneling.

6. The semiconductor integrated circuit device as defined in claim 1, wherein said carrier drainable region includes:

a second gate electrode formed in the insulating layer; and a thin insulating layer region provided between said channel region and said second gate electrode, said thin insulating layer region having a thickness such that said second carriers move from said channel region to said second gate electrode by tunneling through the thin insulating layer region.

7. The semiconductor integrated circuit device as defined in claim 6,
wherein the potential of said second gate electrode is set such that said second carriers can move from said channel region to said second gate electrode by tunneling through the thin insulating layer region.

8. The semiconductor integrated circuit device as defined in claim 1,
said carrier drainable region includes a penetration semiconductor region of a first conductivity type formed in the insulating layer, the penetration semiconductor region extending between said substrate and said semiconductor layer.

9. The semiconductor integrated circuit device as defined in claim 1,
the surface of said gate electrode having the shame shape and size as the surface of said carrier drainable region in said insulating layer.

10. A semiconductor integrated circuit device, comprising:
a substrate;
an insulating layer formed on said substrate;
a semiconductor layer of a first conductivity type formed on said insulating layer;
first and second semiconductor regions of a second conductivity type selectively formed on a surface of said semiconductor layer;
a gate insulating film formed on said semiconductor layer between said first and second semiconductor regions;
a gate electrode formed on said gate insulating film; and
a carrier drainable layer formed in said insulating layer below said gate electrode, the surface of said carrier charge layer having substantially the same shape and size as the surface of said gate electrode,
wherein a portion of said semiconductor layer below said gate includes a channel region of a transistor having said gate electrode and said first and second semiconductor regions, and
said carrier drainable layer is capable of draining carriers from the channel region of said transistor into said substrate.

* * * * *